(12) United States Patent
Watanabe et al.

(10) Patent No.: US 9,171,814 B2
(45) Date of Patent: Oct. 27, 2015

(54) METHOD OF MANUFACTURING SEMICONDUCTOR DEVICE AND SEMICONDUCTOR DEVICE

(71) Applicant: Renesas Electronics Corporation, Kawasaki-shi, Kanagawa (JP)

(72) Inventors: Masaki Watanabe, Kanagawa (JP); Shinji Baba, Kanagawa (JP); Muneharu Tokunaga, Kanagawa (JP); Toshihiro Iwasaki, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/645,289

(22) Filed: Mar. 11, 2015

(65) Prior Publication Data

US 2015/0187720 A1    Jul. 2, 2015

Related U.S. Application Data

(63) Continuation of application No. 14/139,948, filed on Dec. 24, 2013, now Pat. No. 8,994,175.

(30) Foreign Application Priority Data

Mar. 22, 2013   (JP) .................. 2013-061089

(51) Int. Cl.
*H01L 23/522* (2006.01)
*H01L 23/00* (2006.01)
(Continued)

(52) U.S. Cl.
CPC ............ *H01L 24/16* (2013.01); *H01L 23/3157* (2013.01); *H01L 23/49816* (2013.01); *H01L 2224/13147* (2013.01); *H01L 2224/1607* (2013.01); *H01L 2224/16055* (2013.01); *H01L 2224/16113* (2013.01); *H01L 2224/16147* (2013.01); *H01L 2224/17134* (2013.01); *H01L 2924/0665* (2013.01)

(58) Field of Classification Search
CPC .... H01L 24/06; H01L 23/49838; H01L 24/81
USPC .................. 361/764, 774, 777; 257/737, 775; 438/613, 666
See application file for complete search history.

(56) References Cited

U.S. PATENT DOCUMENTS

| 6,043,145 A | 3/2000 | Suzuki et al. |
| 6,229,711 B1 | 5/2001 | Yoneda |
| 2007/0035036 A1* | 2/2007 | Sota et al. ..................... 257/784 |

(Continued)

FOREIGN PATENT DOCUMENTS

| JP | 05-308184 A | 11/1993 |
| JP | 2000-077471 A | 3/2000 |

(Continued)

*Primary Examiner* — George Fourson, III
(74) *Attorney, Agent, or Firm* — Miles & Stockbridge P.C.

(57) ABSTRACT

To improve coupling reliability in flip chip bonding of a semiconductor device. By using, in the fabrication of a semiconductor device, a wiring substrate in which a wiring that crosses an opening area of a solder resist film on the upper surface of the wiring substrate has, on one side of the wiring, a bump electrode and, on the other side, a plurality of wide-width portions having no bump electrode thereon, a solder on the wiring can be dispersed to each of the wide-width portions during reflow treatment in a solder precoating step. Such a configuration makes it possible to reduce a difference in height between the solder on each of terminals and the solder on each of the wide-width portions and to enhance the coupling reliability in flip chip bonding.

8 Claims, 16 Drawing Sheets

(51) Int. Cl.
*H01L 23/31* (2006.01)
*H01L 23/498* (2006.01)

(56) References Cited

U.S. PATENT DOCUMENTS

2007/0262425 A1 11/2007 Seko
2008/0160331 A1 7/2008 Kukimoto et al.
2009/0044967 A1* 2/2009 Nakahama et al. ........... 174/250
2011/0156248 A1 6/2011 Matsuki
2014/0060904 A1 3/2014 Kajihara
2014/0284789 A1 9/2014 Watanabe et al.

FOREIGN PATENT DOCUMENTS

JP 2008-080396 A 4/2008
WO WO 2009-034628 A1 3/2009

* cited by examiner

METHOD OF MANUFACTURING SEMICONDUCTOR DEVICE AND SEMICONDUCTOR DEVICE

CROSS-REFERENCE TO RELATED APPLICATIONS

The disclosure of Japanese Patent Application No. 2013-061089 filed on Mar. 22, 2013 including the specification, drawings and abstract is incorporated herein by reference in its entirety.

BACKGROUND

The present invention relates to a manufacturing technology of a semiconductor device and the semiconductor device, for example, a technology effective when applied to a semiconductor device obtained by mounting a semiconductor chip on a wiring substrate via a bump electrode.

Japanese Patent Laid-Open No. 2008-80396 (Patent Document 1) describes a solder paste composition to be used for precoating the surface of an electrode with a solder and containing a solder powder or a precipitation type solder material and a flux.

Japanese Patent Laid-Open No. Hei 5(1993)-308184 (Patent Document 2) describes a solder-coated circuit board having, on a pad thereof, a solder layer having a thickness necessary for soldering a component lead. The pad has such a structure that it has a width partially increased in a pad length direction and has, on the resulting wide-width portion, a solder bump portion having a solder layer thicker than that of another portion.

WO2009/034628 (Patent Document 3) describes a solder precoated substrate having a coupling conductor pattern comprised of a wiring pattern which will be a wiring and a coupling pad formed continuously with the wiring pattern at a position at which a bump provided on an electronic part is to be bonded. The coupling pad is formed so as to have a width size greater than that of the wiring pattern.

Japanese Patent Laid-Open No. 2000-77471 (Patent Document 4) describes a flip chip packaging substrate having a conductor pattern comprised of a wiring pattern and a coupling pad to which a bump is to be bonded. Further, it describes a technology of forming the coupling pad so as to have a width size greater than that of the wiring pattern.

[Patent Document 1] Japanese Patent Laid-Open No. 2008-80396
[Patent Document 2] Japanese Patent Laid-Open No. Hei 5(1993)-308184
[Patent Document 3] WO2009/034628
[Patent Document 4] Japanese Patent Laid-Open No. 2000-77471

SUMMARY

There is a BGA (ball grid array) package having a structure in which a semiconductor chip has been mounted on a wiring substrate via a bump electrode formed as a coupling terminal on the surface of the semiconductor chip.

The wiring substrate of this BGA package requires, on the surface thereof, an area for placing a plurality of lead portions to be coupled to a plurality of bump electrodes placed on the side of the semiconductor chip. In this area, an insulating film formed on the surface of the wiring substrate has been partially opened and the lead portions have been arranged so as to be exposed from this opening portion of the insulating film.

Such a wiring substrate of BGA has, on the back surface side thereof, a plurality of lands for coupling the external terminals of BGA thereto and the lead portions on the surface side have been electrically coupled to the lands on the back surface side via wirings, respectively.

On the surface side of the substrate, therefore, wirings have been led from the lead portions for flip chip bonding exposed in the opening portion of the insulating film to an area either inside or outside of the opening portion of the insulating film and these wirings have been led to be coupled to the lands on the back surface side.

When the number of pins increases and wiring density becomes higher as the BGA has higher functions, wirings which should be led to cross both areas inside and outside of the opening portion of the insulating film become necessary on the surface side of the substrate.

In flip chip bonding, the upper surface of the lead portions is sometimes pre-coated with a solder in order to stably couple a plurality of bump electrodes of the semiconductor chip to the lead portions of the wiring substrate. During precoating, the upper surface of the wiring that crosses the opening portion of the insulation portion of the wiring substrate and therefore has an exposed surface is also precoated with the solder.

The present inventors studied bonding through flip chip packaging using a wiring substrate equipped with the above-mentioned wirings that cross the opening portion and as a result, found the problem as described below.

In a step of precoating, with a solder, the upper surface of a plurality of lead portions of a wiring substrate before a flip chip packaging step, when a solder is supplied onto the lead portions and a solder reflow is conducted, the solder may accumulates, after the reflow, on any position on the wiring that crosses the opening portion. If the height of this accumulated solder becomes higher than the height of the bump electrode of the semiconductor chip, contact (interference) between the accumulated solder and the surface of the semiconductor chip occurs during flip chip bonding and the semiconductor chip is lifted up by the accumulated solder, which inevitably leads to a coupling failure (uncoupling) between the bump electrode and the lead portion because it disturbs the bump electrode of the semiconductor chip from reaching the lead portion of the wiring substrate.

An object of the embodiment disclosed herein is to provide a technology capable of improving coupling reliability in flip chip bonding of a semiconductor device.

Another object and novel features will be apparent from the description herein and accompanying drawings.

A method of manufacturing a semiconductor device according to one embodiment includes a step of preparing a wiring substrate having a first surface having thereon a plurality of terminals, the first surface having a first area obtained by opening an insulating film, a second area placed inside the first area, and a third area placed outside the first area; and a step of preparing a semiconductor chip having, on a plurality of surface electrodes thereof, bump electrodes. Further, the method includes a step of electrically coupling the bump electrodes of the semiconductor chip to the terminals of the wiring substrate via a coupling member. The wiring substrate has, in the first area thereof, the terminals and a wiring crossing the first area and this wiring has a first portion crossing the first area and a second portion exposed from the second area or the third area and coupled to some of the terminals. The terminals of the second portion have thereon the bump electrode and the first portion has a wide-width portion having a greater width than the wiring.

According to the above-mentioned embodiment, flip chip bonding of a semiconductor device can be conducted with improved coupling reliability.

DETAILED DESCRIPTION

Figure 1:
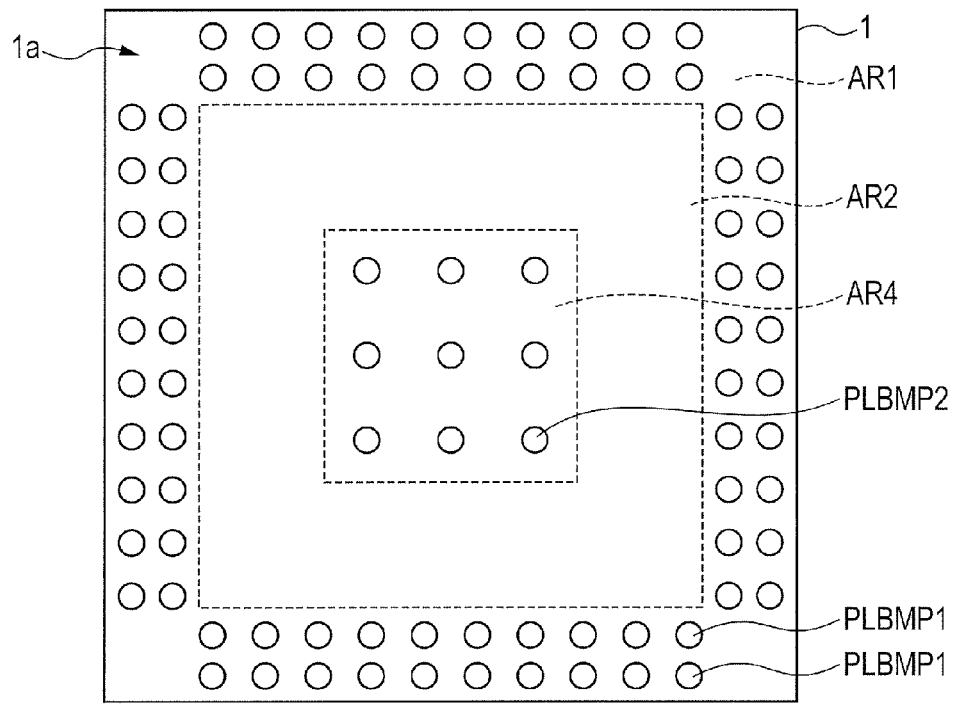
FIG. 1 is a plan view showing one example of the structure of the main surface of a semiconductor chip to be mounted on a semiconductor device of Embodiment.

In the following embodiments, descriptions on the same or similar portions are not repeated in principle unless otherwise particularly necessary.

In the following embodiments, descriptions are divided into a plurality of sections or embodiments if necessary for convenience's sake. These sections or embodiments are not independent each other, but in a relation such that one is a modification example, details or complementary description of a part or whole of the other one unless otherwise specifically indicated.

In the following embodiments, when a reference is made to the number of components (including the number, value, amount, range, or the like), the number is not limited to a specific number but can be greater than or less than the specific number unless otherwise specifically indicated or principally apparent that the number is limited to the specific number.

Moreover in the following embodiments, it is needless to say that the constituent components (including component steps) are not always essential unless otherwise specifically indicated or principally apparent that they are essential.

In the following embodiments, with regard to any constituent component, the term "comprises A", "composed of A", "have A", "contains A" or the like does not exclude another component unless otherwise specifically indicated that the component is limited only to the component referred to. Similarly, in the following embodiments, when a reference is made to the shape or positional relationship of the constituent components, that substantially analogous or similar to it is also embraced unless otherwise specifically indicated or principally apparent that it is not. This also applies to the above-mentioned value, range, or the like.

The embodiment will next be described in detail referring to drawings. In all the drawings for describing the embodiment, members having the same functions are identified by like reference numerals and an overlapping description thereof is not repeated. Even a plan view may be hatched to facilitate understanding of the drawings.

<Description on Problem Referring to Drawings>

First, the problem of flip chip bonding of a semiconductor device investigated by the present inventors for comparison will be described referring to some drawings.

Figure 24:
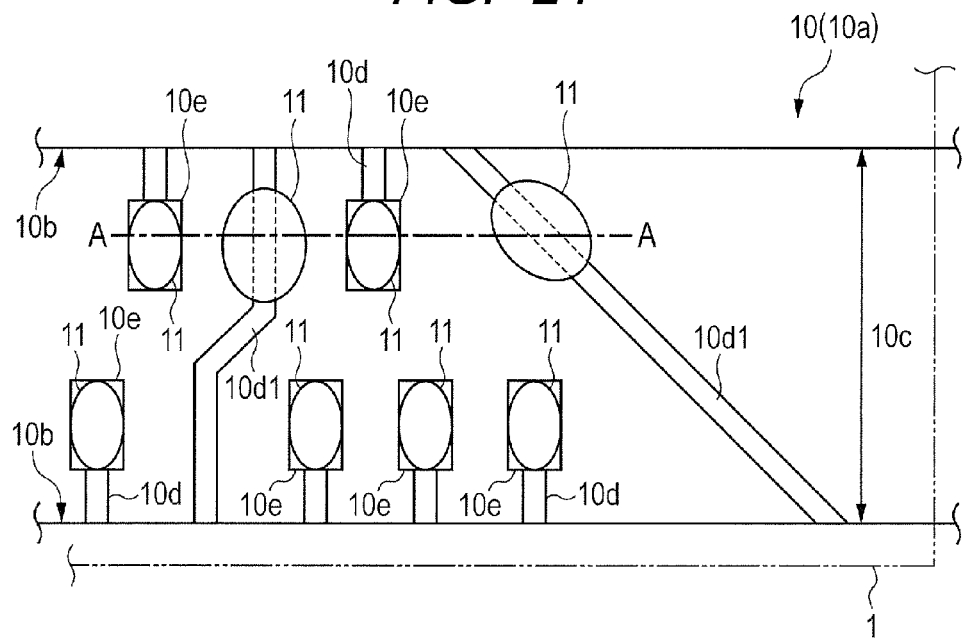
FIG. 24 is a partial plan view showing the structure of a flip chip bonding portion in a semiconductor device of Comparative Example.
Figure 25:
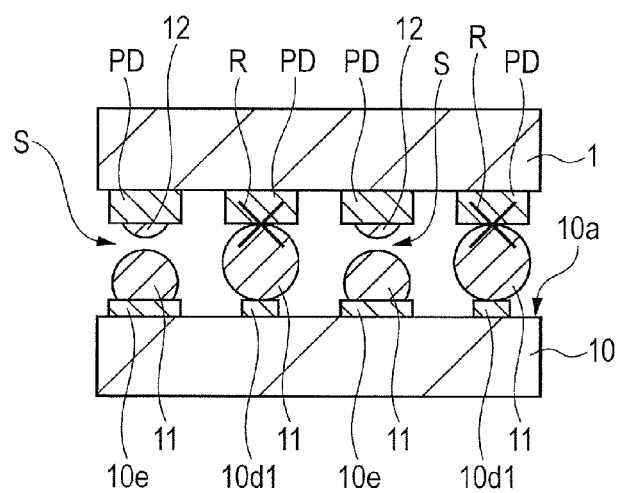
FIG. 25 is a partial cross-sectional view showing the structure taken along a line A-A shown in FIG. 24.

FIG. 24 is a partial plan view showing the structure of a flip chip bonding portion in a semiconductor device of Comparative Example investigated by the present inventors; and FIG. 25 is a partial cross-sectional view showing the structure taken along a line A-A shown in FIG. 24.

As shown in FIG. 24, a wiring substrate 10 has, on an upper surface 10a thereof, an insulating film 10b and an opening portion 10c formed in the insulating film 10b has therein a plurality of terminals (lead portions) 10e for conducting flip chip bonding to a semiconductor chip 1 shown in FIG. 25. These terminals have been arranged in two rows and have been exposed. The terminals 10e respectively have surfaces precoated with a solder 11.

On the wiring substrate 10, wirings 10d have been lead from the terminals 10e for flip chip bonding placed in the opening portion 10c of the insulating film 10b to any area inside or outside the opening portion 10c of the insulating film 10b and these wirings 10d have been led to bump lands on the back surface side. When the number of pins increases and the wiring density becomes high as the semiconductor device has higher functions, a wiring 10d1 that crosses areas inside and outside the opening portion 10c of the insulating film 10b and is drawn around becomes necessary on the side of the upper surface 10a of the wiring substrate 10.

The terminals 10e have respective surfaces precoated with the solder 11, but when the wiring 10d1 is formed in the opening portion 10c, this wiring 10d1 is also precoated with the solder 11. This means that when a solder is supplied onto the wiring 10d or wiring 10d1 and solder reflow is conducted, the solder 11 is formed on the terminal 10e and the wiring 10d1 after reflow.

At this time, the solder 11 sometimes accumulates in an arbitrary place of the wiring 10d1 crossing the opening portion 10c and the height of the solder which has accumulated at this portion (which will hereinafter be called "solder reservoir portion") becomes high.

As a result, as shown in Portion R of FIG. 25, during flip chip bonding, when the height of the solder 11 which has accumulated on the wiring 10d1 exceeds the height of the solder 11 on the terminal 10e to be coupled originally to the pad PD of the semiconductor chip 1, contact (interference) between the solder 11 formed by accumulation and the surface of the semiconductor chip 1 occurs and the semiconductor chip 1 is lifted up by the solder 11 formed by accumulation.

The present inventors have found that as a result, a bump electrode (bump electrode 12) of the semiconductor chip 1 does not reach the terminal 10e of the wiring substrate 10 and a coupling failure (uncoupling) between the bump electrode and the terminal 10e occurs.

In particular, the above-mentioned solder reservoir portion is easily formed as the wiring 10d1 in the opening portion 10c becomes longer. This means that when the wiring 10d1 in the opening portion 10c is long, a temperature distribution occurs in the wiring 10d1 heated at the time of reflow and the solder on the high temperature portion melts first. On the solder that melts first, another solder that melts thereafter accumulates and in such a manner a solder reservoir portion is formed.

When the solder reservoir portion and the surface of the semiconductor chip 1 come into contact with each other, the semiconductor chip 1 is mounted obliquely, which tends to cause a packaging failure of the semiconductor chip 1. Moreover, when the solder reservoir portion is formed on the wiring 10d1 in the opening portion 10c, a void tends to be formed in the vicinity of the solder reservoir portion at the time when an underfill is filled in a molding step conducted after flip chip bonding, which may have an adverse effect on the reliability of the semiconductor device.

It is to be noted that when the wiring substrate 10 is a through-hole substrate, the wiring density cannot be increased easily compared with a buildup substrate having a wiring density increased by forming fine-pitch wirings. It is therefore inevitable to form a wiring such as the wiring 10d1 that crosses the opening portion 10c in order to increase the wiring density. Using a through-hole substrate, therefore, tends to cause the above-mentioned problem further.

The through-hole substrate referred to herein has a plurality of through-holes or vias penetrating through the substrate from the surface to the back surface. Since buildup layers (wiring layers) cannot be formed thereon different from a buildup substrate, it is a substrate not suited for increasing the wiring density. Compared with the buildup substrate, however, the through-hole substrate is inexpensive because no buildup layers are formed thereon.

In the present embodiment, therefore, a measure is taken to improve coupling reliability in the flip chip bonding of a semiconductor device while using an inexpensive through electrode substrate. A semiconductor device of the present embodiment that has taken this measure and a manufacturing method thereof will next be described.

<Constitution of Semiconductor Device of Present Embodiment>

Figure 2:
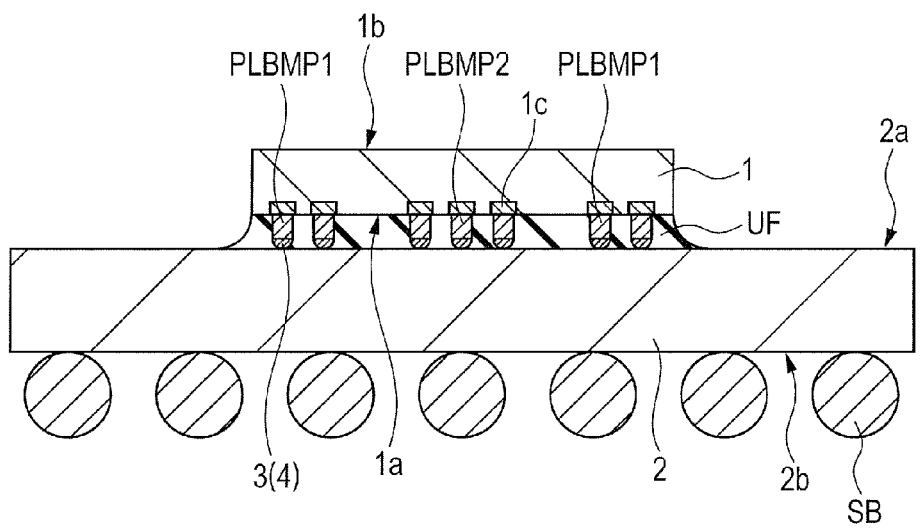
FIG. 2 is a cross-sectional view showing one example of the structure of the semiconductor device of Embodiment.
Figure 3:
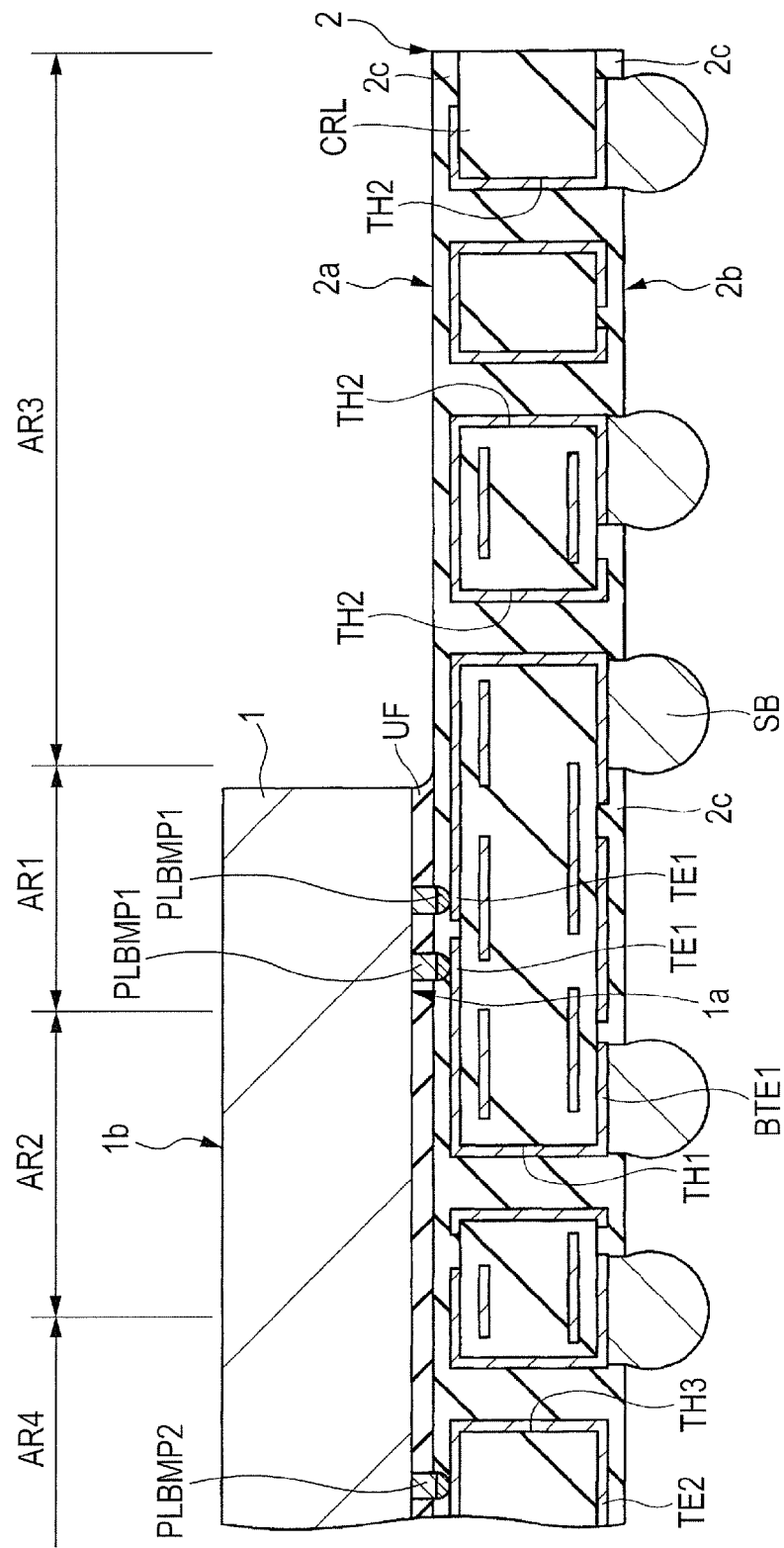
FIG. 3 is a partially enlarged cross-sectional view showing one example of the detailed structure of the semiconductor device shown in FIG. 2.
Figure 4:
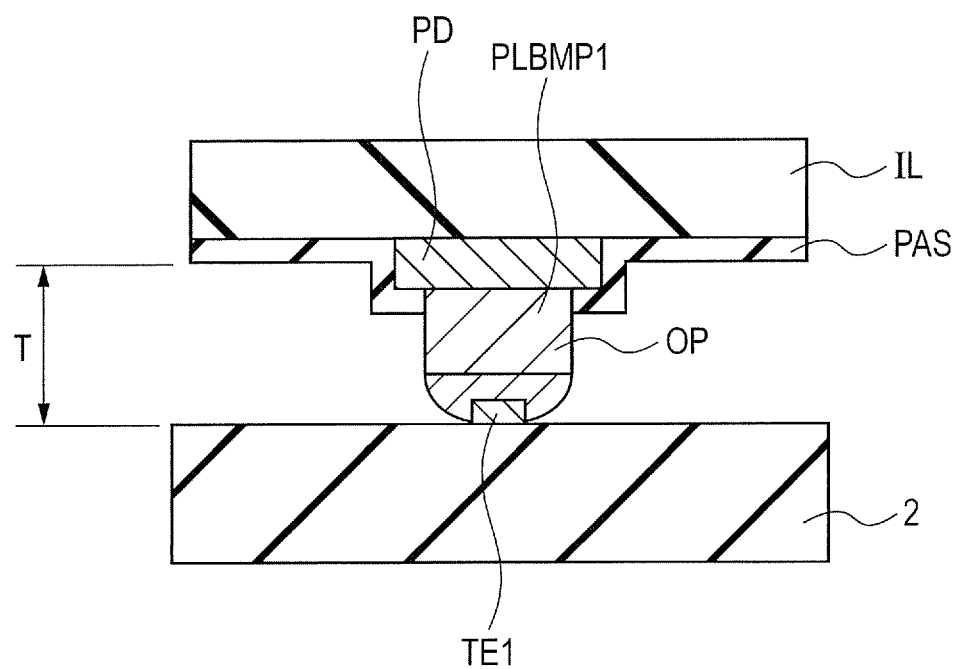
FIG. 4 is a partial cross-sectional view showing one example of a coupling state of a pillared bump electrode in the semiconductor device shown in FIG. 2.
Figure 5:
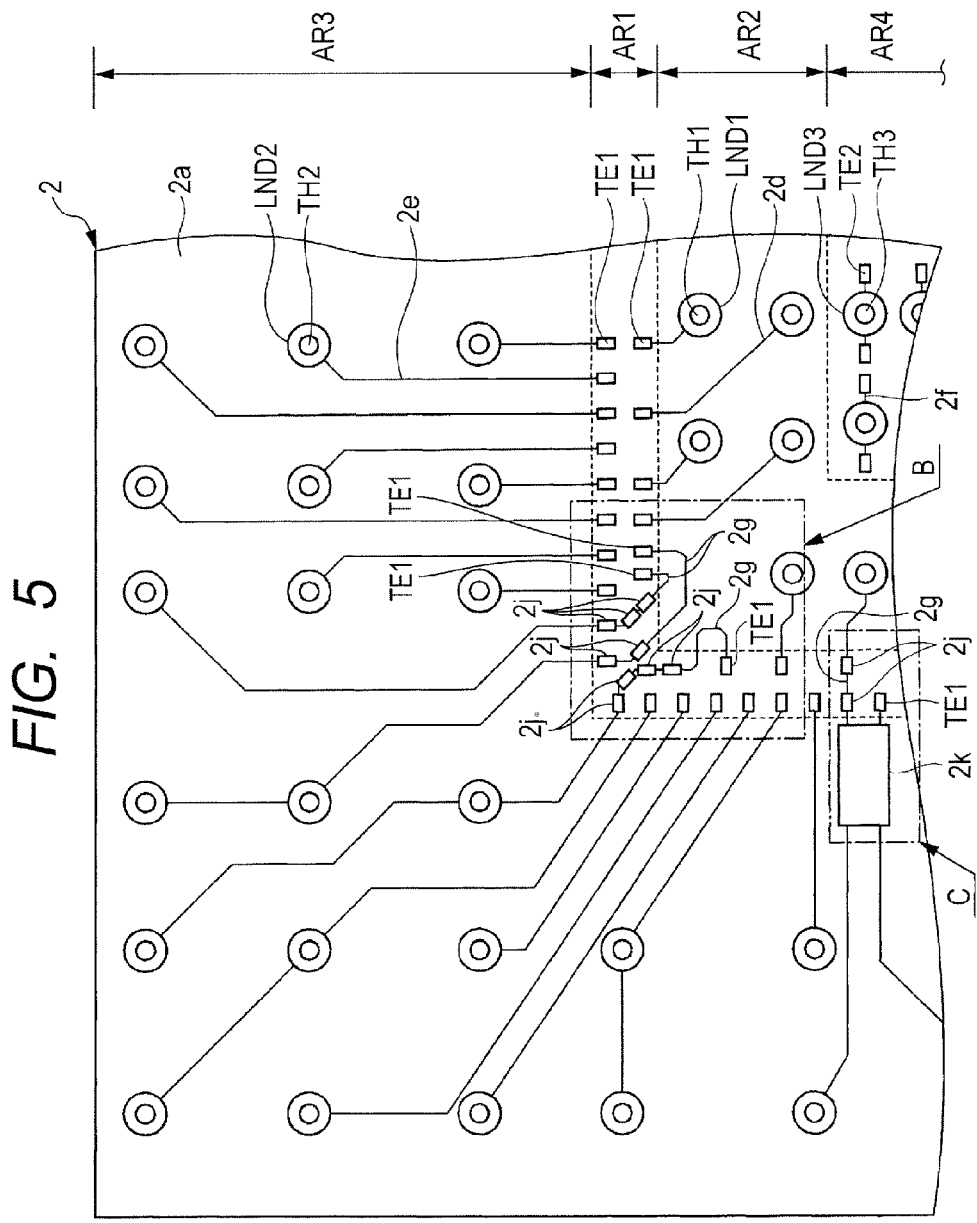
FIG. 5 is a partial plan view showing one routing example of a wiring on the upper surface of a wiring substrate to be mounted on the semiconductor device of Embodiment.
Figure 6:
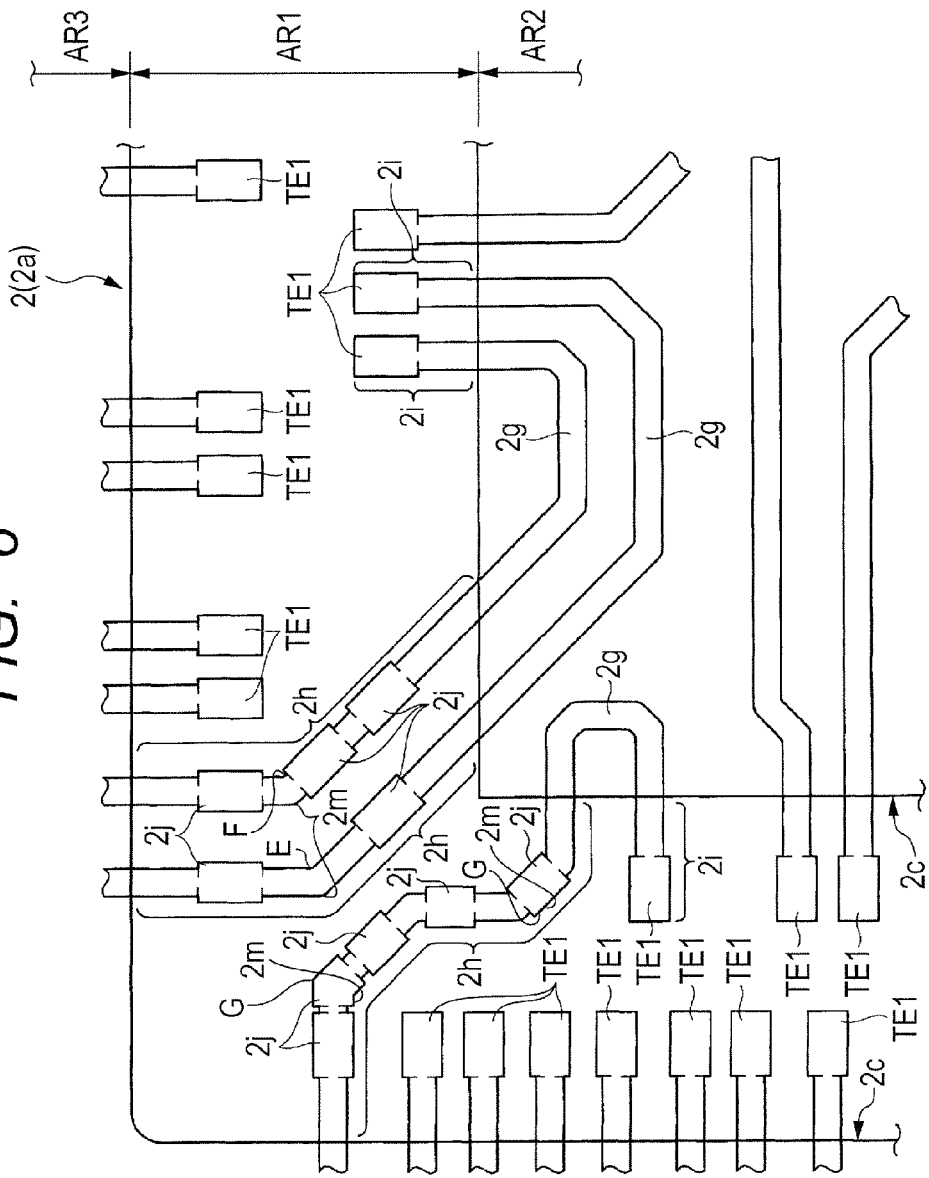
FIG. 6 is a partially enlarged plan view showing one example of the structure of Portion B shown in FIG. 5.
Figure 7:
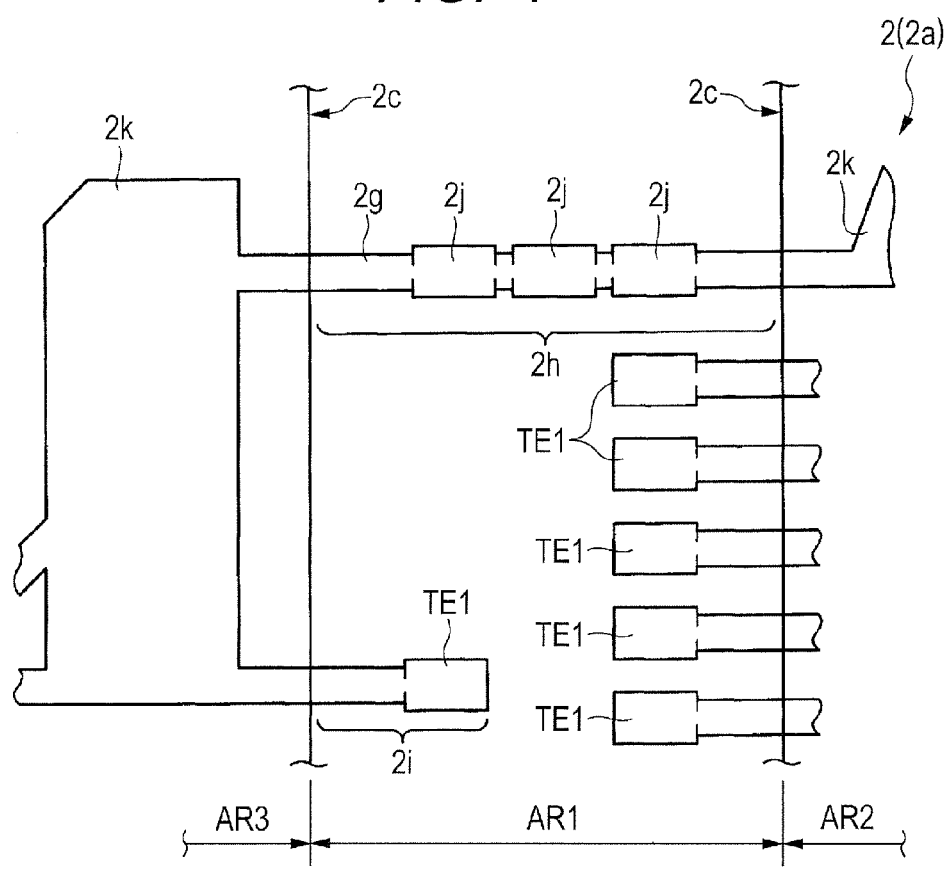
FIG. 7 is a partially enlarged plan view showing one example of the structure of Portion C shown in FIG. 5.

FIG. 1 is a plan view showing one example of the structure of the main surface of a semiconductor chip to be mounted on a semiconductor device of Embodiment; FIG. 2 is a cross-sectional view showing one example of the structure of the semiconductor device of Embodiment; FIG. 3 is a partially enlarged cross-sectional view showing one example of the detailed structure of the semiconductor device shown in FIG. 2; and FIG. 4 is a partial cross-sectional view showing one example of a coupling state of a pillared bump electrode in the semiconductor device shown in FIG. 2. FIG. 5 is a partial plan view showing one routing example of a wiring on the upper surface of a wiring substrate to be mounted on the semiconductor device of Embodiment; FIG. 6 is a partially enlarged plan view showing one example of the structure of Portion B shown in FIG. 5; and FIG. 7 is a partially enlarged plan view showing one example of the structure of Portion C shown in FIG. 5.

As shown in FIG. 1, the semiconductor chip 1 to be mounted on the semiconductor device of the present embodiment has a square shape and the semiconductor chip 1 has, in each area on the main surface (first main surface) 1a of the semiconductor chip 1, a pillared bump electrode PLBMP1 and a pillared bump electrode PLBMP2. These pillared bump electrode PLBMP1 and pillared bump electrode PLBMP2 are each comprised of, for example, a pillared portion composed of copper (Cu) and a coupling portion made of a solder formed on this pillared portion. In this embodiment, the pillared portion has a height of, for example, about 30 μm, while the coupling portion has a height (solder height) of about 15 μm. The pillared portion has a cylindrical or cuboidal shape. In a planar view, the pillared portion having a cylindrical shape has a diameter of from about 30 to 35 μm and the pillared portion having a cuboidal shape is from about 30 to 35 μm on a side.

Described specifically, in the semiconductor chip 1 of the present embodiment, the main surface 1a of the semiconductor chip 1 has been divided into, as shown in FIG. 1, an area (first area) AR1, an area (second area) AR2 present inside the area AR1, and an area (fourth area) AR4 present inside this area AR2. The area AR1 has therein a plurality of pillared bump electrodes PLBMP1, while the area AR4 has therein a plurality of pillared bump electrodes PLBMP2. This means that the pillared bump electrodes PLBMP1 and the pillared bump electrodes PLBMP2 are present with the area AR2 therebetween. At this time, the area AR1 has therein the pillared bump electrodes PLBMP1 in a plurality of rows (two rows in FIG. 1) and the area AR4 has therein the pillared bump electrodes PLBMP2 with equal intervals.

In the present embodiment, the minimum pitch between two adjacent bumps of the pillared bump electrodes PLBMP1 placed in the area AR1 is smaller than the minimum pitch between two adjacent bumps of the pillared bump electrodes PLBMP2 placed in the area AR4. The minimum pitch between two adjacent bumps of the pillared bump electrodes PLBMP1 placed in the area AR1 is from about 40 to 60 μm.

Even if the minimum pitch between two adjacent bumps of the pillared bump electrodes PLBMP1 becomes equal to or greater than the minimum pitch between two adjacent bumps of the pillared bump electrodes PLBMP2, such a case is not particularly excluded.

The area AR2 has therein neither the pillared bump electrode PLBMP1 nor the pillared bump electrode PLBMP2.

The semiconductor chip 1 may however have, on the entire main surface 1a thereof, bump electrodes BMP.

Next, the configuration of the semiconductor device of the present embodiment will be described. As shown in. FIG. 2, the semiconductor device of the present embodiment has a through-hole substrate 2 and this through-hole substrate 2 has, on the back surface (second surface) 2b, which is the lower surface of the through-hole substrate 2, a plurality of solder balls SB. On the other hand, the through-hole substrate 2 has, on the upper surface (first surface) thereof, the semiconductor chip 1.

At this time, the semiconductor chip 1 is on the upper surface 2a of the through-hole substrate 2 so as to electrically couple the pillared bump electrodes PLBMP1 and the pillared bump electrodes PLBMP2 formed respectively on a plurality of electrode pads (surface electrodes) 1c on the main surface 1a of the semiconductor chip 1 to terminals (not illustrated) formed on the upper surface 2a of the through-hole substrate 2. The pillared bump electrodes PLBMP1 and PLBMP 2 have been electrically coupled to the terminals of the through-hole substrate 2 via a solder 3(4) which is a coupling member.

A space formed between the semiconductor chip 1 and the through-hole substrate 2 has been filled with an underfill UF which is a molding resin. This underfill UF is, in many cases, an epoxy-based resin and it is used for securing coupling reliability between the semiconductor chip 1 and the through-hole substrate 2.

The back surface (second main surface) 1b of the semiconductor chip 1 has been exposed with the back surface up and this back surface 1b may have thereon a heat radiation member such as heat spreader.

With regard to the semiconductor device of the present embodiment having such a configuration, particularly the internal structure of the through-hole substrate 2 will next be described in further detail. In the present embodiment, as shown in FIG. 3, the through-hole substrate 2 has been made of a core layer CRL containing a glass cloth. This through-hole substrate 2 has through-holes TH1, TH2, and TH3 that penetrate the through-hole substrate 2 from the upper surface 2a to the back surface 2b.

The through-hole substrate 2 has, on the upper surface 2a thereof, a solder resist film (insulating film) 2c and the through-holes TH1, TH2, and TH2 are filled with this solder resist film 2c. The solder resist film 2c has, as shown in FIG. 5, an opening portion (area A1) and in this opening portion, a plurality of terminals (land patterns, foot patterns) TE1 or a plurality of terminals (land patterns, foot patterns) TE2 are exposed.

For example, the through-hole substrate 2 has, on the upper surface 2a thereof, a plurality of terminals TE1 and some of the terminals TE1 are electrically coupled to the through hole TH1 on the upper surface 2a of the through-hole substrate 2 and some of the other terminals TE1 are electrically coupled to the through-hole TH2 similarly on the upper surface of the through-hole substrate 2.

The through-hole substrate 2 also has, on the upper surface 2a thereof, the terminals TE2 and these terminals TE2 are electrically coupled to the through-hole TH3 on the upper surface 2a of the through-hole substrate 2. Moreover, the through-substrate 2 has, on the upper surface 2a thereof, the semiconductor chip 1 and the pillared bump electrode PLBMP1 formed on this semiconductor chip 1 is electrically coupled to the terminal TE1 formed on the upper surface 2a of the through-hole substrate 2.

Similarly, the pillared bump electrode PLBMP2 formed on the semiconductor chip 1 is electrically coupled to the terminal TE2 formed on the upper surface 2a of the through-hole substrate 2. This means that the through-hole substrate 2 has only one wiring layer on the surface and back surface of the core layer CRL and the semiconductor device of the present embodiment has a structure that the pillared bump electrode is electrically coupled to the wiring layer directly.

As shown in FIG. 3, on, the other hand, the through-hole substrate 2 has also, on the back surface 2b thereof, the solder resist film 2c. This solder resist film 2c has therein an opening portion and from this opening portion, a plurality of back surface terminals (lands) BTE1 is exposed. These back surface terminals BTE1 are electrically coupled to the through-holes TH1, TH2, and TH3 on the back surface 2b of the through-hole substrate 2. These back surface terminals BTE1 have thereon a solder ball SB.

More specifically, in the through-hole substrate 2 of the present embodiment, the thickness attributable to the core layer CRL (about 0.4 mm) (in consideration of the wiring thickness on the upper surface 2a and the back surface 2b) is about 0.5 mm and the through-hole diameter is about 150 μm.

Next, the formation positions of the through-holes TH1, TH2, and TH3 in the through-hole substrate 2 of the present embodiment and the formation positions of the terminals TE1 and TE2 on the upper surface 2a of the through-hole substrate 2 will be described.

First, in FIG. 3, the through-hole substrate 2 has thereon the semiconductor chip 1 and it is divided into areas as shown below. Described specifically, among areas on the through-hole substrate 2, an outside area not having thereon the semiconductor chip 1 is defined as an area (third area) AR3. The area having thereon the semiconductor chip 1 is divided into an area AR1 of the semiconductor chip 1, an area AR2 of the semiconductor chip 1, and an area AR4 of the semiconductor chip 1 so as to correspond to the division as shown in FIG. 1. Thus, the area on the upper surface 2a of the through-hole substrate 2 can be divided into the above-mentioned four areas as shown in FIG. 3.

Here, a description will be made on the area AR3. The through-hole substrate 2 has, in the area AR3 thereof, a plurality of through-holes TH2. This means that among the areas of the upper surface 2a of the through-hole substrate 2, the area AR3 has therein a plurality of through-holes TH2 but it has neither the terminal TE1 nor the terminal TE2. In particular, the through-hole TH2 is electrically coupled to the terminal TE1, but the terminal TE1 has not been formed in the area AR3 having therein the through-hole TH2.

Next, a description will be made on the area AR1. In the through-hole substrate 2, the area AR1 has therein a plurality of terminals TE1. This means that among the areas of the upper surface 2a of the through-hole substrate 2, the area AR1 has therein the terminals TE1 but has none of the through-holes TH1, TH2, and TH3. In particular, some terminals TE1 of the terminals TE1 are electrically coupled to the through-hole TH1 and some terminals TE1 of the remaining terminals TE1 are electrically coupled to the through-hole TH2. The area AR1 having therein the terminals TE1 has therein neither the through-hole TH1 nor the through-hole TH2.

The semiconductor chip 1 has, in the area AR1, a plurality of pillared bump electrodes PLBMP1 and the pillared bump electrodes PLBMP1 formed in the area AR1 of the semiconductor chip 1 have been electrically coupled to the terminal TE1 formed in the area AR1 of the through-hole substrate 2 directly.

Next, a description will be made on the area AR2. The through-hole substrate 2 has, in the area AR2 thereof, a plurality of through-holes TH1. This means that among the areas of the upper surface 2a of the through-hole substrate 2, the area AR2 has therein a plurality of through-holes TH1 but it has therein neither the terminal TE1 nor the terminal TE2. In particular, the through-hole TH1 is electrically coupled to the terminal TE1, but the area AR2 having therein the through-hole TH1 does not have therein the terminal TE1. The area AR2 of the semiconductor chip 1 has therein neither the pillared bump electrodes PLBMP1 nor the pillared bump electrodes PLBMP2.

A description will next be made on the area AR4. The through-hole substrate 2 has, in the area AR4 thereof, a plurality of through-holes TH3 and a plurality of terminals TE2. This means that among the areas of the upper surface 2a of the through-hole substrate 2, the area AR4 has both a plurality of through-holes TH3 and a plurality of terminals TE2. In particular, the through-hole TH3 is electrically coupled to the terminal TE2 and this terminal TE2 is also formed in the area AR4 having therein the through-hole TH3. The area AR4 of the semiconductor chip 1 have therein a plurality of pillared bump electrodes PLBMP2 and the pillared bump electrodes PLBMP2 formed in the area AR4 of the semiconductor chip 1 have been directly coupled to the terminals TE formed in the area AR4 of the through-hole substrate 2.

Next, a space (standoff) between the semiconductor chip 1 and the through-hole substrate 2 will be described referring to FIG. 4. In the present embodiment, as shown in FIG. 4, the through-hole substrate 2 has thereon the terminal TE1 and the pillared bump electrode PLBMP1 is mounted on the terminal TE1. This pillared bump electrode PLBMP1 is comprised of, for example, a pillared portion made of copper (Cu) and a coupling portion made of a solder formed on this pillared portion. This pillared bump electrode PLBMP1 lies in the opening portion OP formed in a passivation film (surface protecting film) PAS made of, for example, a silicon nitride film and the pillared bump electrode PLBMP1 lies on a pad PAD (electrode pad is in FIG. 2) exposed from the opening portion OP. This pad PD lies on an interlayer insulating film IL.

Even if the pillared bump electrode PLBMP1 having such a configuration is made smaller, the pillared portion made of copper prevents the space (standoff) T between the semiconductor chip 1 and the through-hole substrate 2 from becoming smaller. This means that the pillared bump electrode BMP is comprised of a coupling portion made of a solder and a pillared portion (copper) having a melting point higher than that of the coupling portion (solder).

When the semiconductor chip 1 is mounted on the through-hole substrate 2 as shown in FIG. 2 and the pillared bump electrode PLBMP1 of the semiconductor chip 1 is coupled to the terminal TE1 of the through-hole substrate 2 by melting the coupling portion (solder) of the pillared bump electrode PLBMP1 at a high temperature (for example, from about 240 to 260° C.), the bump electrode PLBMP1 is not melted at this high temperature because the pillared portion (copper) of the bump electrodes PLBMP1 is higher than the melting point of the coupling portion (solder).

The space (standoff) T as shown in FIG. 4 between the semiconductor chip 1 and the through-hole substrate 2 therefore does not become smaller than the height of the pillared portion (copper) of the pillared bump electrode PLBMP1. As a result, when the pillared bump electrode PLBMP1 as shown in FIG. 4 is used, it is possible to suppress deterioration in filling property of an underfill or deterioration in coupling reliability between the semiconductor chip 1 and the through-hole substrate 2 even if the size of the pillared bump electrode PLBMP1 itself is reduced. The semiconductor chip 1 of the present embodiment therefore uses, for example as shown in FIG. 2 or FIG. 3, the pillared bump electrode PLBMP1 or pillared bump electrode PLBMP2.

In the above-mentioned example, the pillared portion of the pillared bump electrode PLBMP1 is made of copper, but any material (metal) having a melting point higher than that of the coupling portion can be used without a problem. The solder of the coupling portion of the pillared bump electrode PLBMP1 is preferably an Sn—Ag-based or Sn—Ag—Cu-based lead-free solder.

Next, the configuration of the upper surface 2a of the through-hole substrate 2 of the present embodiment will be described while referring to the partial plan view of FIG. 5 in order to clearly show the positional relationship between the through-holes TH1, TH2, and TH3 and the terminals TE1 and TE2. FIG. 5 shows approximately the one fourth of the entire area of the upper surface 2a of the through-hole substrate 2. FIG. 5 shows the area AR1, area AR2, area AR3, and area AR4.

As shown in FIGS. 3 and 5, the area AR3 is an area positioned outside the outer periphery of the semiconductor chip 1 in a planar view. In other words, the area AR3 is an area which does not overlap with the semiconductor chip 1 in a planar view. Further, the area AR1, area AR2, and area AR4 are areas positioned inside the outer periphery of the semiconductor chip 1 in a planar view. In other words, the area AR1, area AR2, and area AR4 are areas overlapping with the semiconductor chip 1 in a planar view.

In FIG. 5, the area AR1 has therein a plurality of terminals TE1. More specifically, the area AR1 has a plurality of terminals TE1 in two rows. For example, the number of the terminals TE1 placed in a row near the outside is greater the number of the terminals TE1 placed in a row near the inside.

The terminals TE1 placed in a row near the outside of this area have been electrically coupled to the through-hole TH2 formed in the area AR3. More specifically, the area AR3 has therein a plurality of through-holes TH2 and it also has lands LND2 so as to come into contact with these through-holes TH2. These lands LND2 have been electrically coupled to the terminals TE1 placed in a row near the outside via a second wiring 2e.

The terminals TE1 placed in a row near the inside of this area have been electrically coupled to the through-hole TH1 formed in the area AR2. More specifically, the area AR2 has a plurality of through-holes TH1 and it has also lands LND1 so as to come into contact with these through-holes TH1. These lands LND1 have been coupled to the terminals TE1 placed in a row near the inside via a first wiring 2d.

The area AR4 has therein a plurality of through-holes TH3 and a plurality of terminals TE2. The terminals TE2 formed in the area AR4 have been electrically coupled to the through-holes TH3 formed in the same area AR4. More specifically, the area AR4 has a plurality of through-holes TH3 and it has lands LND3 so as to come into contact with the through-holes TH3. These lands LND3 have been coupled to the terminals TE2 via a third wiring 2f. This means that the terminals TE1 and the terminals TE2 have been placed with the area AR2 therebetween.

<Characteristic of Semiconductor Device of Present Embodiment>

The semiconductor device of the present embodiment has the above-mentioned configuration. The characteristic of the device will next be described in detail.

In the through-hole substrate 2 of the semiconductor device of the present embodiment, the area AR1 (first area) shown in FIG. 5 and obtained by opening the solder resist film 2c formed on the upper surface 2a shown in FIG. 3 has a plurality of terminals TE1 in two rows, that is, inside and outside of this area and it has further a wiring 2g that crosses this area AR1 and extends to both the area AR2 and the area AR3.

This means that the semiconductor device of the present embodiment employs the through-hole substrate 2 and compared with a buildup substrate, it is difficult to increase the wiring density to satisfy an increase in the number of pins. A measure for increasing the wiring density is therefore taken by providing the wiring 2g that crosses the area AR1, which is an opening area of the solder resist film 2c, and extends to both the areas AR2 and AR3.

This wiring 2g that crosses the area AR1 has, as shown in FIG. 6, a first portion 2h that crosses the area AR1 and a second portion 2i that is coupled to some of the terminals TE1, among a plurality of the terminals TE1, after exposure in the area AR2 (or the area AR3). The first portion 2h has a wide-width portion 2j, that is, a portion having a width greater than that of the wiring 2g.

This wide-width portion 2j is provided for dispersing and accumulating a solder to be formed on this wiring 2g during solder precoating. It therefore serves to prevent or suppress the formation of a solder reservoir portion on the wiring 2g.

Therefore, the wiring 2g placed in the area AR1 has preferably a plurality of wide-width portions 2j. By using such a wiring having a plurality of wide-width portions 2j, the dispersing number of solders can be increased and thereby generation of a solder reservoir portion can be suppressed.

In addition, as shown later by Portion P in FIG. 14, when the wiring 2g placed in the area AR1 has a plurality of wide-width portions 2j, the wide-width portions 2j are placed so that a distance L, in the extending direction E of the wiring 2g, between two adjacent wide-width portions 2j in the first portion 2h (refer to FIG. 6) does not exceed a total length (L1+ L2), in the extending direction F, of the terminal TE1 and the wiring 2g in the second portion 2i (refer to FIG. 6).

In other words, when the distance L, in the extending direction E of the wiring 2g, between two adjacent wide-width portions 2j in the first portion 2h exceeds the total length (L1+L2), in the extending direction F, of the terminal TE1 and the wiring 2g in the second portion 2i, another wide-width portion 2j is placed between these two adjacent wide-width portions 2j.

By making the length of a portion composed only of the wiring 2g, in the wiring 2g placed so as to be exposed in the area AR1, as short as possible, the solder 3 (solder layer, refer to FIG. 14) to be formed on this wiring 2b by solder precoating is dispersed and at the same time, the solder 3 is accumulated on each of the wide-width portions 2j. Since a solder material has a property of flowing and accumulating on the wide-width portion when melted on a wiring, the solder 3 is dispersed on the wide-width portions 2j and at the same time, is accumulated on each of the wide-width portions 2j.

This makes it possible to prevent or suppress the formation of a solder reservoir portion on the wiring 2g exposed in the area AR1.

Further, as shown in FIG. 6, in the area AR1 which is an opening area, the first portion 2h and the second portion 2i have been electrically coupled to each other below the solder resist film 2c in the area AR2.

Described specifically, the wiring 2g has, at one end thereof, the terminal TE1 of the second portion 2i and has a plurality of wide-width portions 2j in the first portion 2h that crosses the area AR1. The wiring 2g that crosses the area AR1 with the first portion 2h having a plurality of wide-width portions 2j runs to the inside of the substrate and extends to the area AR2, changes its extending direction in the area AR2 toward the area AR1, is exposed in the area AR1 again, and becomes the second portion 2i. This second portion 2i has the terminal TE1.

Many of the first portions 2h of the wirings 2g are placed in the vicinity of relatively the end of a plurality of terminals TE1 arranged in the area AR1 (refer to Portion B of FIG. 5). This is because with an increase in the wiring density due to an increase in the number of pins of the semiconductor device or the like, the number of the terminals TE1 provided in the area AR1 increases so that positions where the wirings 2g are placed are likely to be close to the vicinity of the end of the arrangement of the terminals TE1 rather than the center thereof.

In short, it is preferred to place the wiring 2g in the vicinity of the end of the arrangement of the terminals TE1 because there is a wider space in the vicinity of the end than near the center of the arrangement of the terminals TE1. As shown in Portion C in FIG. 5, however, the wiring 2g that crosses the area AR1 may be placed near the center of the arrangement of the terminals TE1.

It is to be noted that the wiring 2g may be any of a wiring for signal, a wiring for GND, and a wiring for power source.

FIG. 7 shows one example of a wiring pattern when the wiring 2g is for GND. When the wiring 2g is for GND, the wiring 2g is often coupled to a plane wiring 2k in either or both of the area AR3 and area AR2. The wiring 2g shown in FIG. 7 has one end coupled to the plane wiring 2k in the area AR3, extends again from this plane wiring 2k, exposed in the area AR1 to be a second portion 2i, and has therein a terminal TE1, while it has the other end coupled to another plane wiring 2k in the area AR2.

Figure 14:
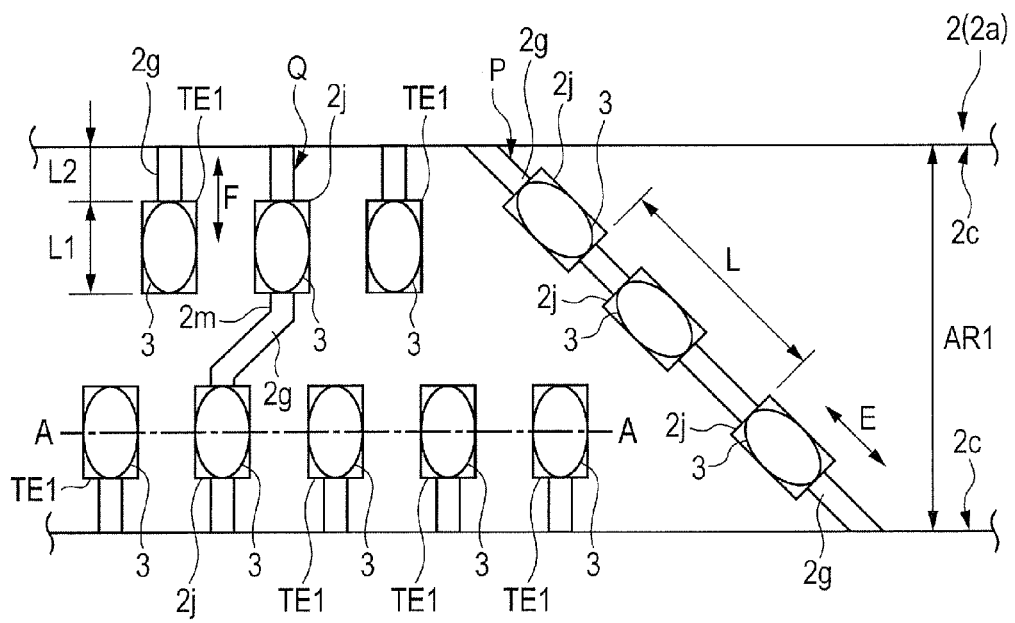
FIG. 14 is a partial plan view showing one example of the state of the solder after reflow treatment of the wiring substrate to be used in Embodiment.

The wiring 2g may have, in the first portion 2h, a bend portion 2m at which the wiring 2g is bent as shown in FIG. 6 and by Portion Q of FIG. 14 shown later. Formation of a solder reservoir portion on the bend portion 2m due to excessive accumulation of a solder material however should be avoided.

When the wiring 2g has, in the first portion 2h thereof, the bend portion 2m as shown in FIG. 6, a plurality of wide-width portions 2j provided in the first portion 2h requires some ingenuity in their arrangement. First, a plurality of wide-width portions 2j is placed in the vicinity of the bend portion 2m. If there is a sufficient space on both sides of the bend portion 2m, the wide-width portions 2j are preferably placed on both sides of the bend portion 2m so as to sandwich the bend portion 2m between them as shown in Portion E and Portion F in FIG. 6.

When a plurality of bend portions 2m is formed at various angles, in other words, when the number of the bend portions 2m is large and the straight line portion of the wiring 2g is short, some wide-width portions 2j, among the wide-width portions 2j, are placed so as to overlap with the bend portion 2m as shown in Portion G of FIG. 6.

Thus, there is a space on both sides of the bend portion 2m, the wide-width portions 2j are placed on both sides of the bend portion 2m so as to sandwich the bend portion between them and when the straight line portion of the wiring 2g on both sides of the bend portions 2m is short and there remains only a narrow space, the wide-width portion 2j is placed so as to overlap with the bend portion 2m.

By placing the wide-width portions 2j on both sides of the bend portion 2m so as to sandwich the bend portion between them or by placing the wide-width portion 2j so that the wide-width portion 2j overlaps with the bend portion 2m, a solder material which will otherwise accumulate on the bend portion 2m can be dispersed and at the same time, the solder material can be accumulated on each of the wide-width portions 2j while preventing it from becoming high.

By solder precoating, a solder (solder layer) 3 is formed on each of the terminals TE1 and wide-width portions 2j as shown later in FIG. 15. After flip chip bonding, as shown later in FIG. 19, the pillared bump electrode PLBMP1(2), (bump electrode) is mounted on the terminal TE1 of the second portion 2i (refer to FIG. 6) of the wiring 2g, while the pillared bump electrode PLBMP1(2) is not mounted on the wide-width portion 2h of the first portion 2h and only the solder 3 is formed.

<Method of Manufacturing Semiconductor Device of Present Embodiment>

The semiconductor device of the present embodiment has the configuration as described above. One example of manufacturing method of it will next be described referring to some drawings.

Figure 8:
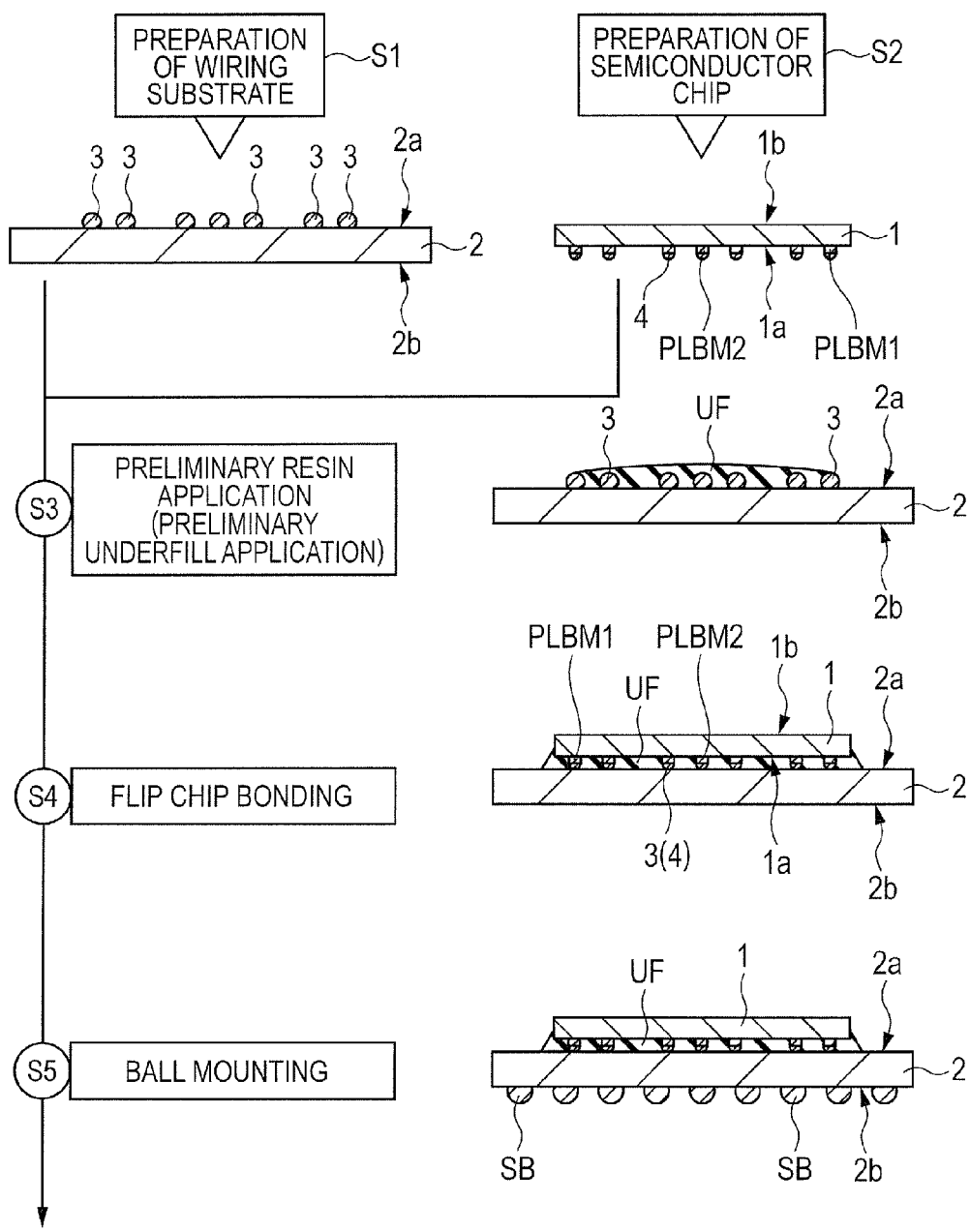
FIG. 8 includes a flow chart and cross-sectional views showing one example of a fabrication procedure of the semiconductor device of Embodiment.
Figure 9:
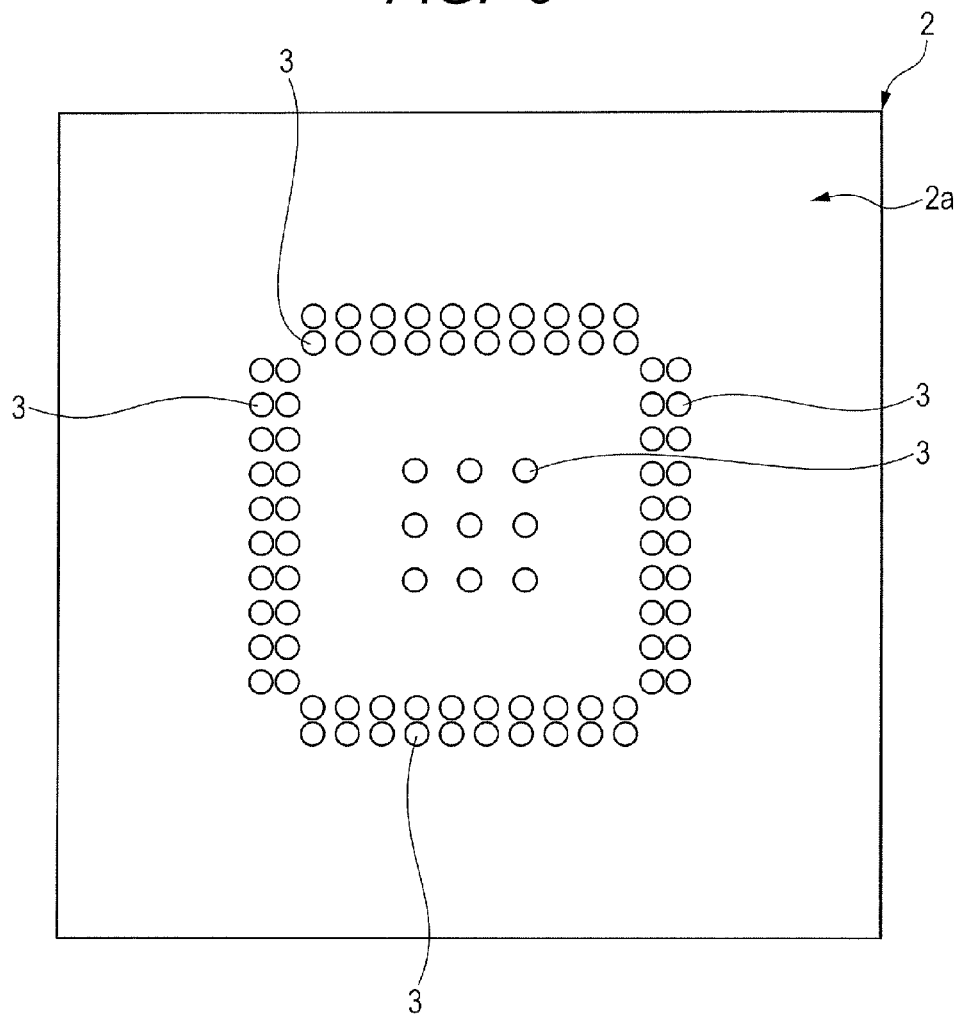
FIG. 9 is a plan view showing one example of the structure of a wiring substrate to be used in fabrication shown in FIG. 8.
Figure 10:
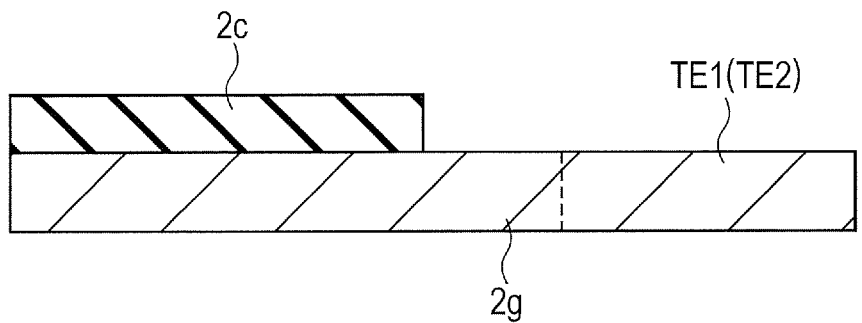
FIG. 10 is a cross-sectional view showing one example of the structure of a lead before formation of solder plating in the manufacture of the wiring substrate shown in FIG. 9.
Figure 11:
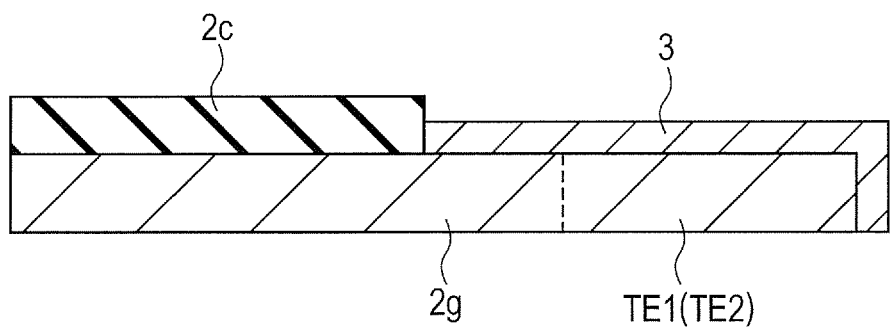
FIG. 11 is a cross-sectional view showing one example of the structure of the lead after formation of solder plating in the manufacture of the wiring substrate shown in FIG. 9.
Figure 12:
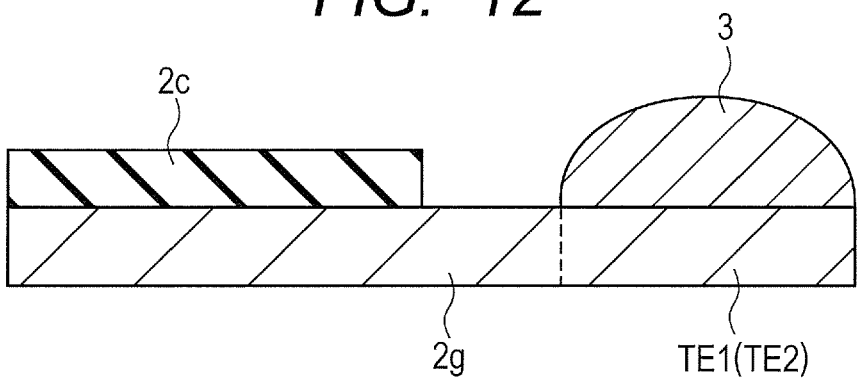
FIG. 12 is a cross-sectional view showing one example of the state of a solder after reflow treatment in the manufacture of the wiring substrate shown in FIG. 9.
Figure 13:
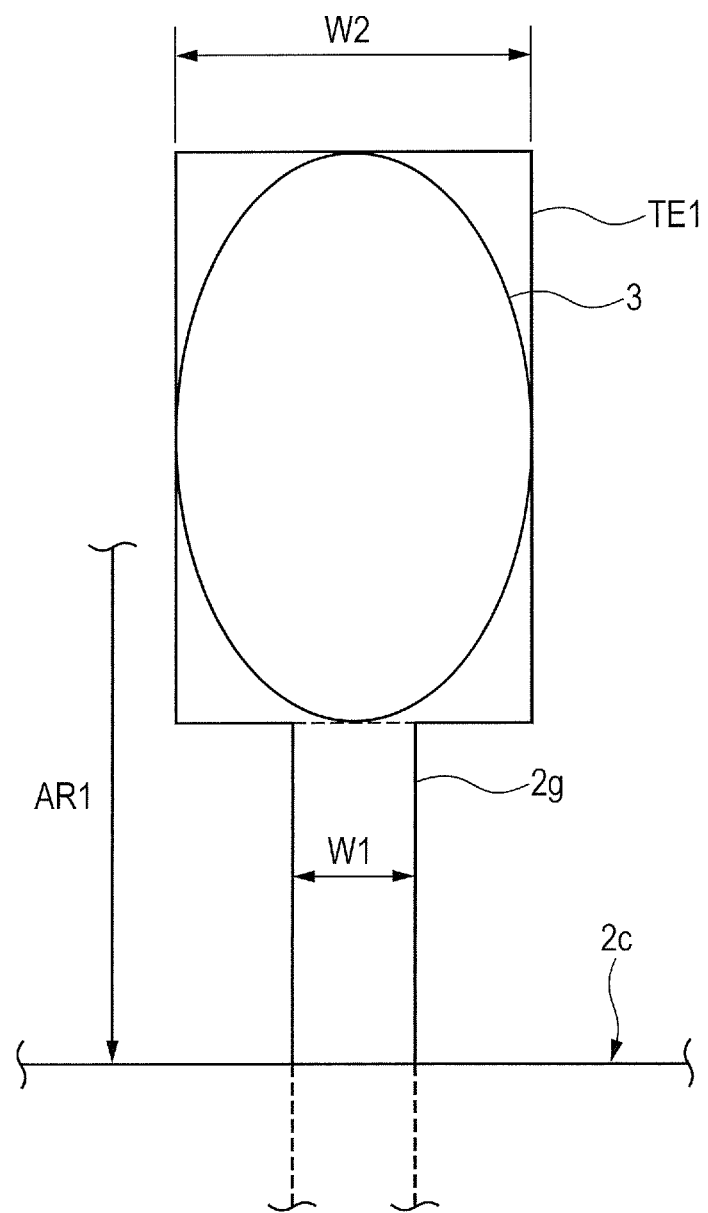
FIG. 13 is an enlarged plan view showing one example of the state of the solder shown in FIG. 12.
Figure 16:
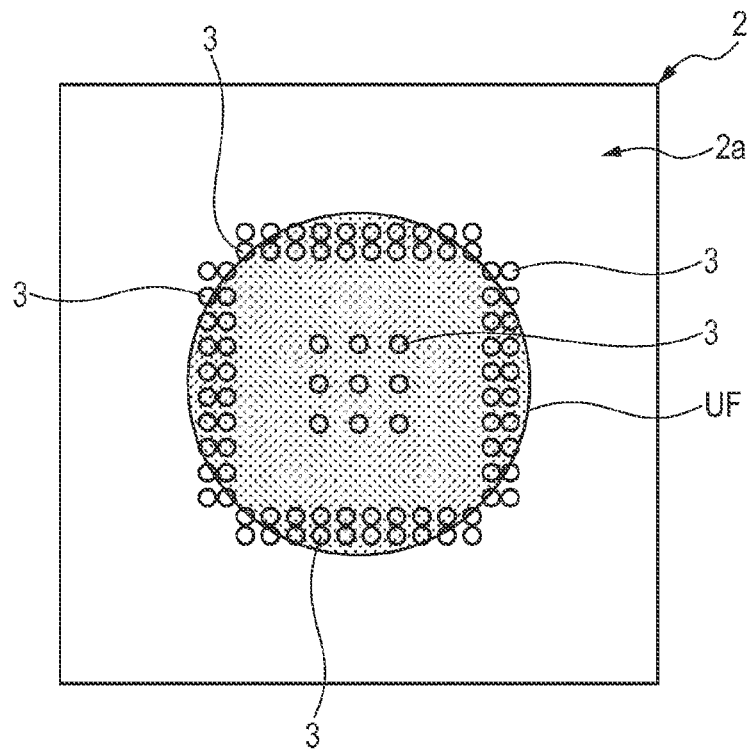
FIG. 16 is a plan view showing one example of the structure after underfill application in the fabrication shown in FIG. 8.
Figure 17:
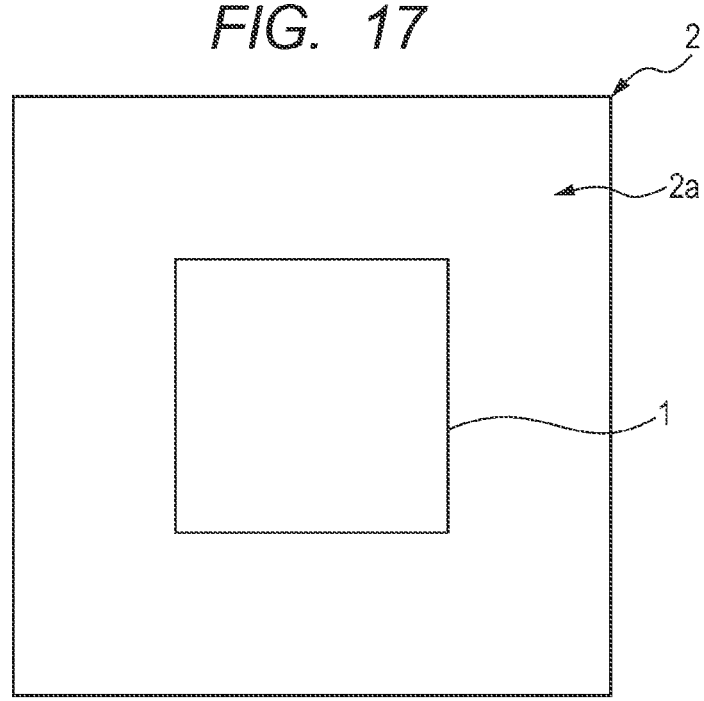
FIG. 17 is a plan view showing one example of the structure after flip chip bonding in the fabrication shown in FIG. 8.
Figure 18:
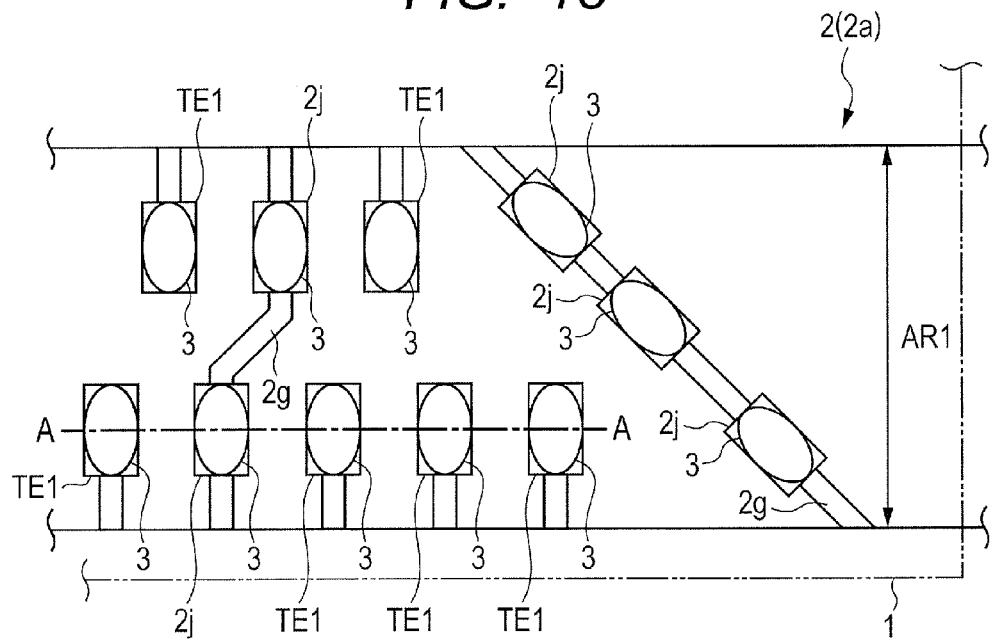
FIG. 18 is a partial plan view showing one example of the structure after flip chip bonding shown in FIG. 17.
Figure 19:
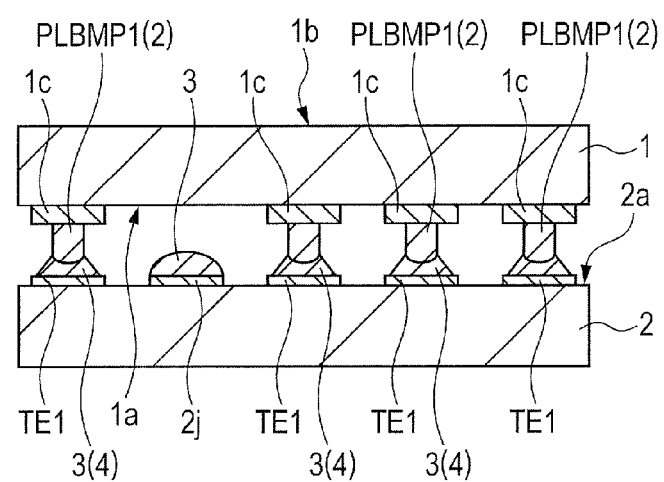
FIG. 19 is a partial cross-sectional view showing the structure taken along the line A-A shown in FIG. 18.

FIG. 8 includes a flow chart and cross-sectional views showing one example of a fabrication procedure of the semiconductor device of Embodiment; FIG. 9 is a plan view showing one example of the structure of a wiring substrate to be used in the fabrication shown in FIG. 8; FIG. 10 is a cross-sectional view showing one example of the structure of a lead before formation of solder plating in the manufacture of the wiring substrate shown in FIG. 9; and FIG. 11 is a cross-sectional view showing one example of the structure of the lead after formation of solder plating in the manufacture of the wiring substrate shown in FIG. 9. FIG. 12 is a cross-sectional view showing one example of the state of a solder after reflow treatment in the manufacture of the wiring substrate shown in FIG. 9; FIG. 13 is an enlarged plan view showing one example of the state of the solder shown in FIG. 12; FIG. 14 is a partial plan view showing one example of the state of the solder after reflow treatment of the wiring substrate to be used in Embodiment; and FIG. 15 is a partial cross-sectional view showing the structure taken along the line A-A shown in FIG. 14. FIG. 16 is a plan view showing one example of the structure after underfill application in the fabrication shown in FIG. 8; FIG. 17 is a plan view showing one example of the structure after flip chip bonding in the fabrication shown in FIG. 8; FIG. 18 is a partial plan view showing one example of the structure after flip chip bonding shown in FIG. 17; and FIG. 19 is a partial cross-sectional view showing the structure taken along the line A-A shown in FIG. 18.

First, preparation of a substrate shown in Step S1 of FIG. 8 is conducted. In this step, a through-hole substrate 2 of the present embodiment is prepared. This through-hole substrate 2 has, on the upper surface 2a thereof, for example, a plurality of terminals TE1 and TE2 and a plurality of through-holes TH1, TH2, and TH3 as shown in FIG. 5.

This substrate further has an area AR1, which is an opening area of a solder resist film 2c, having the terminals TE1 in two rows. This area AR1 has a wiring 2g that crosses this area AR1 and extends to both areas AR2 and AR3. The wiring 2g has, similar to the through-hole substrate 2 of the present embodiment as shown in FIGS. 5 to 7, a first portion 2h crossing the area AR1 and a second portion 2i exposed from the area AR2 and then coupled to some terminals TE1, among a plurality of terminals TE1. The first portion 2h has a wide-width portion 2j having a width greater than that of the wiring 2g.

The wiring 2g has, in the first portion 2h thereof, a plurality of wide-width portions 2j as shown later by Portion P of FIG. 14 so that a distance L, in the extending direction E of the wiring 2g in the first portion 2h (refer to FIG. 6), between two adjacent wide-width portions 2j does not exceed a total length (L1+L2), in the extending direction F, of the terminal TE1 and the wiring 2g in the second portion 2i (refer to FIG. 6).

Then, the terminals TE1 and TE2 of such a through-hole substrate 2 are subjected to solder precoating to form solders (solder layers) 3 as shown in FIG. 9 on the terminals TE1 and TE2, respectively.

In the above-mentioned solder precoating, a solder 3 is formed on the terminal TE1 (TE2) exposed from the solder resist film 2c of the through-substrate 2 shown in FIG. 10, for example, by electrolytic Sn (tin) plating treatment or the like, followed by solder precoating. The terminal TE1 (TE2) is, for example, a copper wiring. In solder precoating, as shown in FIG. 11, the electrolytic Sn plating treatment or the like is conducted to cover the terminal TE1 (TE2) with the solder 3. Then, as shown in FIG. 12, reflow treatment is conducted to precoat the terminal TE1 (TE2) with the solder 3.

The solder precoating treatment shown in FIGS. 10 to 12 is similarly conducted on each of the wide-width portions 2j. This means that when the solder precoating treatment is conducted, plurality of the terminals TE1 and each of the wide-width portions 2j are precoated with solders 3, respectively in the area AR1 as shown in FIG. 14.

In the through-hole substrate 2 of the present embodiment, the wiring 2g that is exposed in the area AR1 and crosses the area AR1 has a plurality of wide-width portions 2j (for example, Portion P or Portion Q of FIG. 14) at this time so that a solder in a fluid state during solder precoating can be dispersed to each of the wide-width portions 2j and the solder can be accumulated on each of the wide-width portions 2j.

It is preferred to make the shapes of the wide-width portion 2j and the terminal TE1 in a planar view (length, width, and the like in a planar view) substantially equal to each other. This makes it possible, as shown in FIG. 15, to form the solder 3 formed on the wide-width portion 2j by precoating and the solder 3 formed on the terminal TE1 by precoating with almost the same height.

The width of each of the terminal TE1 and the wiring 2g in the area AR1, which is an opening area of the solder resist film 2c, will next be described. As shown in FIG. 13, supposing that the width of the wiring 2g exposed from the solder resist film 2c, which is an insulating film, in the area AR1 is W1 and the width of the terminal TE1 is W2, W1 and W2 satisfy the following ranges: W1<W2 and W2=(from 1.5 to 3.0)×W1 wherein W2 is the width of the terminal TE1. These definitions W1 and W2 equally apply to the terminal TE2.

The width and size of the wide-width portion 2j in a planar view are preferably equal to those of the terminal TE1. By making the width or size of the wide-width portion 2j equal to the width or size of the terminal TE1, the thickness or size of the solder 3 formed on the terminal TE1 by precoating and that formed on the wide-width portion 2j can be made substantially equal to each other.

Figure 15:
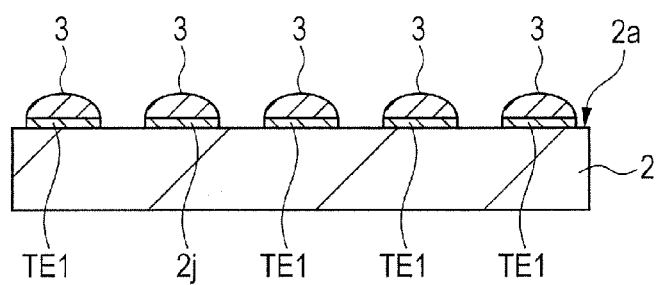
FIG. 15 is a partial cross-sectional view showing the structure taken along the line A-A shown in FIG. 14.

In short, as shown in FIG. 15, the solder 3 on the wide-width portion 2j and the solder 3 on the terminal TE1 are allowed to have the same height.

Next, preparation of a chip shown in Step S2 of FIG. 8 is conducted. As shown in FIGS. 1 and 2, a semiconductor chip 1 has, on a plurality of electrode pads (surface electrodes) 1c on the main surface 1a thereof, a plurality of pillared bump electrodes PLBMP1 and PLBMP 2.

These pillared bump electrodes PLBMP1 and PLBMP 2 have been provided on an unillustrated semiconductor wafer which is at a stage of a wafer before dicing and the pillared bump electrodes PLBMP1 and PLBMP 2 have at the top thereof a solder 4.

Next, previous resin application of Step 3 shown in FIG. 8 is conducted. In this step, an underfill UF is applied to a chip mounting area (more specifically, area AR1+area AR2+area AR4 shown in FIG. 5) of the upper surface 2a of the through-hole substrate 2 shown in FIG. 16. The underfill UF is, for example, an epoxy-based resin. It is preferred to use a quick curing resin NCP (Non-conductive paste).

Next, flip chip bonding shown in Step S4 is conducted. As shown in FIG. 8, the semiconductor chip 1 is mounted on the upper surface 2a of the through-hole substrate 2 by flip chip bonding. Described specifically, the semiconductor chip 1 is mounted on the through-hole substrate 2 so as to bring the pillared bump electrodes PLBMP1 and PLBMP 2 formed on the semiconductor chip 1 into direct contact with the terminals TE1 and TE2 formed on the through-hole substrate 2 shown in FIG. 5, followed by heating at high temperature.

As a result, the solder 4 on the pillared bump electrodes PLBMP1 and PLBMP 2 and the solder 3 on the terminals TE1 and TE2 on the through-hole substrate 2 are melted, by which the terminals TE1 and TE2 of the through-hole substrate 2 and copper of the pillared bump electrodes PLBMP1 and PLBMP 2 are electrically coupled to each other via the solder 3(4) serving as a coupling member.

In such a manner, flip chip bonding is conducted as shown in FIG. 17.

During this flip chip bonding, the wet underfill UF spreads in the space between the semiconductor chip 1 and the through-hole substrate 2 and the space is filled with the underfill. When a quick curing resin (non-conductive paste NCP) is used as the underfill UF, the underfill UF cures quickly.

In the present embodiment, the pillared bump electrodes PLBMP1 and PLBMP 2 capable of securing height even if they are made smaller are used for coupling between the semiconductor chip 1 and the through-hole substrate 2 so that spreading of the wet underfill UF is not disturbed.

After completion of flip chip bonding, as shown in FIG. 19, each of the terminals TE1 has thereon a bump electrode (pillared bump electrode PLBMP1), but the wide-width portion 2j has no bump electrode thereon.

Next, ball mounting shown in Step S5 of FIG. 8 is conducted. In this step, a plurality of solder balls SB is mounted on the back surface (surface on a side opposite to the chip mounting surface) 2b of the through-hole substrate 2. In such a manner, the semiconductor device of the present embodiment can be manufactured.

According to the present embodiment, the bump electrode is mounted on one side (terminal TE1) of the wiring 2g that crosses the opening area (area AR1) of the solder resist film 2c of the through-hole substrate 2 and the wide-width portion 2j having no bump electrode thereon is formed on the other side so that by the reflow treatment during solder precoating on each of the terminals TE1, the solder 3 can placed on the wiring 2g while dispersing it to the wide-width portions 2j as shown in FIG. 14.

In other words, by making the length of a portion composed only of the wiring 2g, in the wiring 2g exposed in the area AR1, as short as possible, the solder 3 formed on this wiring 2g during solder precoating can be dispersed and at the same time, the solder 3 can be accumulated on the wide-width portion 2j. By making use of the property of the solder material that it flows and accumulates on a wide-width portion when melted on the wiring, the solder 3 is dispersed and accumulated on the wide-width portion 2j of the wiring 2g.

This makes it possible to reduce a difference in height between the solder 3 on each of the terminals TE1 and the solder 3 on the wide-width portion 2j as shown in FIG. 15.

In other words, it is possible to suppress formation of a portion (solder reservoir portion) at which the height of a solder 11 is high due to partial accumulation of a solder on a wiring 10d1 as shown in FIG. 25. This means that in the present embodiment, as shown in FIGS. 18 and 19, the height of the solder on each of the terminals TE1 and the height of the solder on the wide-width portion 2j can be made equal to each other.

By making their heights equal to each other, it is possible to prevent or suppress occurrence of such a trouble as described below during flip chip bonding. The trouble is that due to contact (interference) between the solder 11 accumulated on the wiring 10d1 and the surface of the semiconductor chip 1, the semiconductor chip 1 is lifted up by the accumulated solder 11 and the bump electrode 12 of the semiconductor chip 1 fails to reach the solder 11 on the terminal 10e as shown in Portion R and Portion S of FIG. 25. As a result, a coupling failure of bump electrodes (pillared bump electrodes PLBMP1 and PLBMP 2 in the present embodiment) during flip chip bonding can be reduced.

The present embodiment can also prevent or suppress inclined mounting of the semiconductor chip 1 during flip chip bonding which will otherwise occur due to contact (interference) between the solder 11 accumulated on the wiring 10d1 and the surface of the semiconductor chip 1 as shown in FIG. 25.

Further, after flip chip bonding, when a space between the substrate and the chip is filled with the underfill UF preliminarily applied onto the substrate, voids are likely to appear due to the solder 11 accumulated on the wiring 10d1 as shown in FIG. 25. In the present embodiment, on the other hand, the solder 3 has no partially higher portion so that formation of voids in the underfill UF can be suppressed.

The present embodiment can therefore improve the coupling reliability in flip chip bonding of a semiconductor device.

First Modification Example

In the above-mentioned embodiment, each of the terminals TE1 of the through-hole substrate 2 is precoated with the solder 3 when the through-hole substrate 2 is prepared. Alternatively, a semiconductor device may be fabricated using a substrate having the terminal TE1 precoated with the solder 3, which substrate has been delivered as the through-hole substrate 2.

In this case, the precoating step of the solder 3 can be omitted so that a semiconductor device can be obtained with an improved fabrication efficiency.

Second Modification Example

Figure 20:
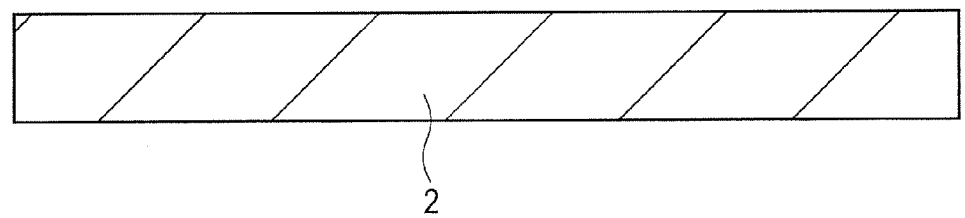
FIG. 20 is a cross-sectional view showing the structure of a wiring substrate to be used in the fabrication of a semiconductor device of Second Modification Example of Embodiment.
Figure 21:
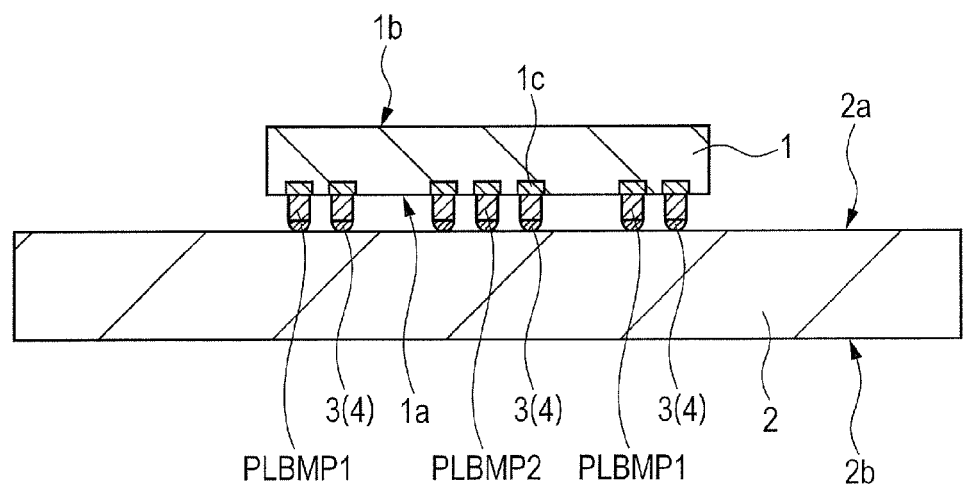
FIG. 21 is a cross-sectional view showing the structure after flip chip bonding in the fabrication of the semiconductor device of Second Modification Example of Embodiment.
Figure 22:
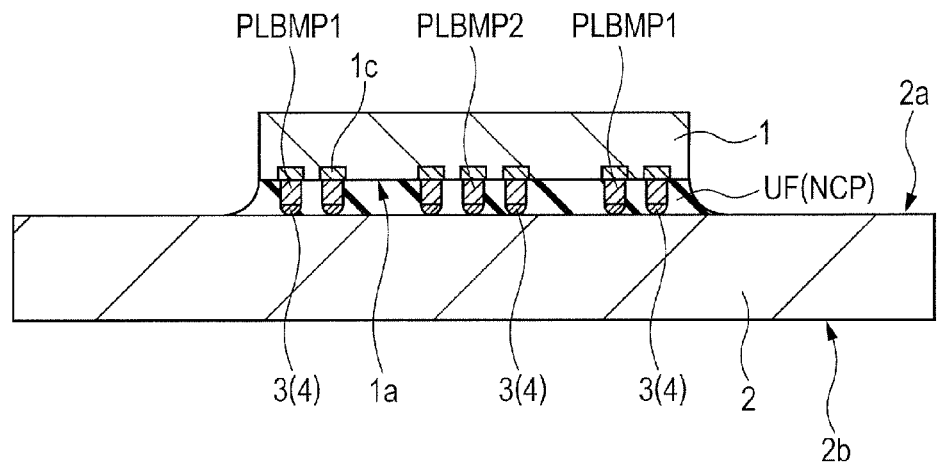
FIG. 22 is a cross-sectional view showing the structure after application of an underfill in the fabrication of the semiconductor device of Second Modification Example of Embodiment.
Figure 23:
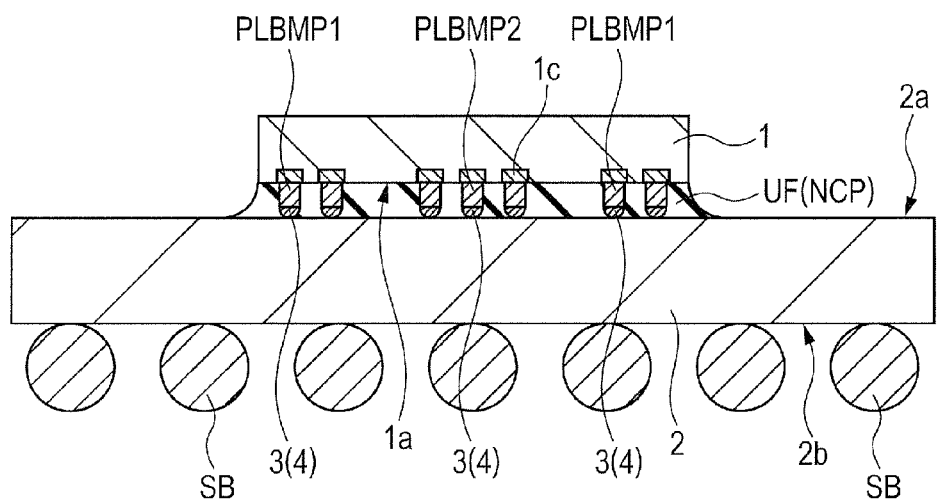
FIG. 23 is a cross-sectional view showing the structure after ball mounting in the fabrication of the semiconductor device of Second Modification Example of Embodiment.

FIG. 20 is a cross-sectional view showing the structure of a wiring substrate to be used in the fabrication of a semiconductor device of Second Modification Example of the embodiment; FIG. 21 is a cross-sectional view showing the structure after flip chip bonding in the fabrication of the semiconductor device of Second Modification Example; FIG. 22 is a cross-sectional view showing the structure after application of an underfill in the fabrication of the semiconductor device of Second Modification Example; and FIG. 23 is a cross-sectional view showing the structure after ball mounting in the fabrication of the semiconductor device of Second Modification Example.

In the fabrication method described in the above-mentioned embodiment, the underfill UF is applied onto the through-hole substrate 2 prior to flip chip bonding and after application of the underfill UF, flip chip bonding is conducted.

Alternatively, a method of fabricating a semiconductor device by conducting flip chip bonding and then filling the underfill UF between the semiconductor chip 1 and the through-hole substrate 2 may be employed.

The fabrication procedure in this case will next be described referring to FIGS. 20 to 23. First, as shown in FIG. 20, a through-hole substrate 2 of the present embodiment is prepared. This through-hole substrate 2 has, for example as shown in FIG. 5, a plurality of terminals TE1 and TE2, a plurality of through-holes TH1, TH2, and TH3, and the like.

It further has an area AR1 which is an opening area of a solder resist film 2c and in which the terminals TE1 are provided in two rows. This area AR1 has therein a wiring 2g that crosses this area AR1 and extends to both the areas AR2 and AR3. The wiring 2g has, in a first portion 2h thereof that crosses the area AR1, a plurality of wide-width portions 2j having a width greater than that of the wiring 2g similar to that of the through-hole substrate 2 of the above-mentioned embodiment as shown in FIGS. 5 to 7. It is to be noted that the wide-width portions 2j are placed so that as shown in Portion P of FIG. 14, a distance L, in the extending direction E of the wiring 2g in the first portion 2h (refer to FIG. 6), between two adjacent wide-width portions 2j does not exceed a total length (L1+L2), in the extending direction F, of the terminal TE1 and the wiring 2g in the second portion 2i (refer to FIG. 6).

Next, as shown in FIG. 21, a semiconductor chip 1 is mounted on the through-hole substrate 2. The semiconductor chip 1 thus mounted has, on the main surface 1a thereof, for example, a pillared bump electrode PLBMP1 and a pillared bump electrode PLBMP2. Then, the semiconductor chip 1 is mounted on the through-hole substrate 2 so as to bring the pillared bump electrodes PLBMP 1 and PLBMP 2 formed on the semiconductor chip 1 into direct contact with the terminal TE1 (refer to FIG. 5) formed on the through-hole substrate 2. By heating at high temperature, the solder 4 of the pillared bump electrodes PLBMP 1 and PLBMP 2 and the solder 3 on the terminals TE1 of the through-hole substrate 2 are melted to electrically couple the terminals TE1 and TE2 of the through-hole substrate 2 to copper of the pillared bump electrodes PLBMP1 and PLBMP 2.

Next, as shown in FIG. 22, a space between the semiconductor chip 1 and the through-hole substrate 2 is filled with an underfill UF. In the present embodiment, since the pillared bump electrodes PLBMP1 and PLBMP2 capable of securing a height even if their size is reduced are used for coupling between the semiconductor chip 1 and the through-hole substrate 2, a filling property of the underfill UF can be secured.

Next, as shown in FIG. 23, a solder ball SB is mounted on the back surface 2b of the through-hole substrate 2. Even if the fabrication method of Second Modification Example of the present embodiment is employed, a semiconductor device having the same level as the semiconductor device of the above-mentioned embodiment can be manufactured. Further, an advantage similar to that of the above-mentioned embodiment can be obtained.

The invention made by the present inventors was described specifically based on an embodiment. It is needless to say that the invention is not limited to or by the above-mentioned embodiment, but can be changed in various ways without departing from the gist of the present invention.

For example, in the above-mentioned embodiment, a BGA package structure having, on the back surface 2b of the through-hole substrate 2, a solder ball SB was described as an example of a semiconductor device. The package may be an LGA (land grid array) one having no solder ball SB mounted thereon. When this LGA is employed, the solder ball SB is not mounted so that a material cost corresponding to the solder ball SB can be reduced.

In the above-mentioned embodiment, the through-hole substrate 2 was described as one example of a wiring substrate, but a buildup substrate may be employed as the wiring substrate. Using the buildup substrate increases the wiring density to achieve fine pitch wirings.

In the above-mentioned embodiment, pillared bump electrodes PLBMP 1 and PLBMP 2 were described as an example of a bump electrode for electrically coupling the semiconductor chip to the wiring substrate. Alternatively, a gold bump or the like may be used as the bump electrode. Further, a solder was employed as a member for coupling the bump electrode to the terminal of the wiring substrate, but the coupling member is not limited to the solder.

What is claimed is:
1. A semiconductor device comprising:
a semiconductor chip having a first surface over which a plurality of electrode pads are disposed and a second surface opposite the first surface; and
a wiring board having a first main surface over which a plurality of wirings and an insulating film are formed,
wherein the semiconductor chip is mounted over the first main surface of the wiring board such that the first surface of the semiconductor chip faces the first main surface,
wherein an opening is formed in the insulating film such that parts of a first wiring are exposed from the opening,
wherein each of the parts of the first wiring exposed from the opening are coated with solder,
wherein the first wiring has a first part which is an end portion thereof, a second part, and a third part located between the first and second parts,
wherein, in a plan view, the first and second parts are exposed from the opening and the third part is covered with the insulating film,
wherein, in the plan view, a wide-width portion of which a width is wider than a width of each of other portions in a direction perpendicular to a direction in which each of the plurality of wirings extends is formed at each of the first and second parts,
wherein the wide-width portion of the first part of the first wiring is electrically connected to a first electrode pad of the semiconductor chip via a first bump electrode and the solder coated on the first part, and
wherein the wide-width portion of the second part of the first wiring is not electrically connected to any of the plurality of electrode pads of the semiconductor chip.
2. The semiconductor device according to claim 1,
wherein in the plan view the wiring board has a first area, a second area located inside the first area, and a third area located outside the first area,
wherein the opening is formed at the first area, and
wherein the third part of the first wiring is disposed at the second area and covered with the insulating film of the second area.

3. The semiconductor device according to claim 2,
wherein the first wiring has a fourth part,
wherein the second part is located between the third and fourth parts, and
wherein the fourth part is disposed at the third area and covered with the insulating film of the third area.

4. The semiconductor device according to claim 1,
wherein a plurality of solder balls are disposed on a second main surface of the wiring board opposite the first main surface,
wherein a first wiring is electrically connected to a first solder ball, and
wherein a wiring length from the first part to the first solder ball is longer than a wiring length from the fourth part to the first solder ball.

5. The semiconductor device according to claim 1,
wherein the first wiring is any of a wiring for signal, a wiring for GND, and a wiring for a power source.

6. The semiconductor device according to claim 1,
wherein the opening is formed in the insulating film such that the opening surrounds the semiconductor chip in the plan view.

7. The semiconductor device according to claim 1,
wherein the first bump electrode is Cu pillared bump electrode.

8. The semiconductor device according to claim 1, further comprising:
a sealing resin disposed between the first surface of the semiconductor chip and the first main surface of the wiring board,
wherein a part of the sealing resin is disposed between the wide-width portion of the first part of the first wiring and a part of the first surface of the semiconductor chip directly located above the wide-width portion.

* * * * *